(12) United States Patent
Iizuka et al.

(10) Patent No.: US 7,193,684 B2
(45) Date of Patent: Mar. 20, 2007

(54) PROJECTION EXPOSURE MASK, PROJECTION EXPOSURE APPARATUS, AND PROJECTION EXPOSURE METHOD

(75) Inventors: Kazuo Iizuka, Kanagawa (JP); Junji Isohata, Tokyo (JP); Nobuyoshi Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/331,193

(22) Filed: Jan. 13, 2006

(65) Prior Publication Data

US 2006/0119819 A1 Jun. 8, 2006

Related U.S. Application Data

(62) Division of application No. 10/762,468, filed on Jan. 23, 2004.

(30) Foreign Application Priority Data

Jan. 31, 2003 (JP) ............................. 2003-025174

(51) Int. Cl.
G03B 27/42 (2006.01)
G03B 27/32 (2006.01)
G03F 9/00 (2006.01)

(52) U.S. Cl. ............................ 355/53; 355/77; 430/5
(58) Field of Classification Search ............... 355/53, 355/77; 430/5, 30
See application file for complete search history.

(56) References Cited

U.S. PATENT DOCUMENTS 4,708,466 A 11/1987 Isohata et al. ............... 355/53
4,878,086 A 10/1989 Isohata et al. ............... 355/77
4,998,134 A 3/1991 Isohata et al. ............... 355/53
5,359,389 A 10/1994 Isohata ........................ 355/53
5,661,744 A 8/1997 Murakami et al. ........... 372/57
6,288,772 B1 9/2001 Shinozaki et al. ........... 355/53
6,359,678 B1 3/2002 Ota .............................. 355/53
6,368,756 B1 4/2002 Yamada et al. ............... 430/5
2002/0187440 A1 12/2002 Kochi et al. ............... 430/394
2004/0207784 A1 10/2004 Lim et al. ................... 349/114

FOREIGN PATENT DOCUMENTS

EP  0 986 094 A2   3/2000
JP  11-219900      8/1999
JP  2000-91221     3/2000

OTHER PUBLICATIONS

European Search Report dated Sep. 22, 2005, issued in corresponding European patent application No. EP 04 00 1974, forwarded in a Communication dated Sep. 29, 2005.

*Primary Examiner*—Peter B. Kim
(74) *Attorney, Agent, or Firm*—Fitzpatrick, Cella, Harper & Scinto

(57) ABSTRACT

A projection exposure mask including a first mask pattern for exposing a member to form a continuous pattern thereon, and a second mask pattern for exposing the member to form a discontinuous pattern thereon. One of the first and second mask patterns is a reflecting type mask pattern and the other mask pattern is a transmitting type mask pattern.

7 Claims, 17 Drawing Sheets

PROJECTION EXPOSURE MASK, PROJECTION EXPOSURE APPARATUS, AND PROJECTION EXPOSURE METHOD

This application is a divisional application of copending patent application Ser. No. 10/762,468, filed Jan. 23, 2004.

BACKGROUND OF THE INVENTION

1. Field of the Invention

The present invention relates to a projection exposure mask (an original pattern plate), such as a photomask and a reticle for exposing a member under exposure to transfer a pattern thereon, a projection exposure apparatus, and a projection exposure method, each of which employs the mask.

2. Description of the Related Art

FIG. 18 shows a projection exposure apparatus for use in exposing a large substrate under exposure, such as a liquid crystal display panel, to transfer a circuit pattern thereon.

In FIG. 18, reference numeral 51 shows a mask, 52 a trapezoidal mirror, 53 a convex mirror, 54 a concave mirror, and 55 a substrate under exposure.

For transferring a circuit pattern to the substrate 55 in the exposure apparatus, exposure light L is irradiated to the mask 51, which corresponds to a negative film in photography. The exposure light L is transmitted through a pattern (a mask pattern) formed in the mask 51 via the trapezoidal mirror 52, the convex mirror 53, and the concave mirror 54, which serve as a projection system, and then forms the image of the mask pattern. The substrate 55 is disposed at the position where the mask pattern image is formed. In this manner, the circuit pattern is formed through exposure on the substrate 55.

The provision of a large-diameter projection system capable of exposing a large substrate under exposure to form a whole desired circuit pattern thereon at one time is disadvantageous in the area, weight, stability, and cost of the apparatus. Thus, a frequently employed projection system forms an image of part of a mask pattern in a slit-like shape, wherein a mask and a substrate under exposure are moved in synchronization with the projection system (driven for scanning) to scan an exposure light irradiation area of the mask and an area to be exposed on the substrate, thereby allowing the small projection system to form the image of the pattern through exposure on the large substrate.

In this case, the mask 51 and the substrate 55, which are sized to take account of the size of the mask pattern image formed on the substrate 55 and the projection magnification of the projection system, are relatively moved at a constant speed in the directions indicated by outline arrows in FIG. 18 with a controlled amount of exposure light to perform scan exposure. In the case of the exposure apparatus shown in FIG. 18, the mask 51 and the substrate 55 are mounted on a mask stage 57 and a substrate stage 56, respectively. The stages 57 and 56 are driven in the direction indicated by the outline arrows to scan the irradiation area of the exposure light L in the mask 51 and the area to be exposed on the substrate 55.

A number of projection exposure apparatuses which employ a transmission type mask have been commercially available as the apparatus shown in FIG. 18. In addition, a projection exposure apparatus proposed in Japanese Patent Application Laid-Open No. H11(1999)-219900 (corresponding to U.S. Pat. No. 6,359,678) employs a reflecting type mask for directing exposure light reflected by a mask pattern to a substrate under exposure and exposing the substrate.

The following problems are found in the scan type exposure apparatus in which the mask stage and the substrate stage are moved when the large substrate under exposure is exposed to form the circuit pattern thereon.

(1) As the substrate is increased in size, the mask is also increased in size and the manufacturing cost of the mask is increased.

(2) A larger mask produces a warp thereof due to its own weight in the exposure apparatus to cause difficulty in providing a required exposure resolution.

(3) The entire exposure apparatus is increased in size and weight.

The problem (1) is hereinafter described in detail. In exposure of a substrate, such as a liquid crystal display panel, circuit patterns for exposure include a continuous pattern such as a signal line and a gate line and a discontinuous cyclic pattern consisting of mutually isolated repetitive pattern elements, for example, a gate, a source, a drain, a transparent dot electrode, and a storage capacitor electrode. It is thus difficult to employ a so-called stitching exposure method in terms of formation of the continuous pattern. As a result, the exposure apparatus generally performs exposure at a projection magnification of 1:1 to cause an increased size of the mask in association with a larger size of the substrate for a liquid crystal display panel. This presents a significant problem in time and cost involved in the mask manufacture.

If the continuous pattern and the discontinuous cyclic pattern are processed in separate processes, the number of steps for exposure is increased to create disadvantages in process control and alignment, resulting in a factor which increases time and cost required for mask manufacture.

Next, the problem (2) is described in detail. The mask can be supported at its peripheries in the scan type exposure apparatus. A larger mask causes a warp thereof due to its own weight to use the margin of the focal depth of the projection system on the mask side. Thus, it is difficult to ensure a manufacture margin, such as flatness on the side of the substrate under exposure, leading to difficulty in providing a required exposure resolution.

SUMMARY OF THE INVENTION

It is an object of the present invention to provide a projection exposure mask with a small size and a low cost for exposing a member under exposure to form a continuous pattern and a discontinuous pattern thereon, a projection exposure apparatus, and a projection exposure method, each of which employs the mask. It is also an object of the present invention to provide a method of manufacturing the projection exposure mask.

To achieve the aforementioned objects, a projection exposure mask according to a first aspect of the present invention has a first mask pattern for exposing a member under exposure to form a continuous pattern thereon and a second mask pattern for exposing the member to form a discontinuous pattern thereon. One of the first and second mask patterns is a reflecting type mask pattern and the other mask pattern is a transmitting type mask pattern.

A second aspect of the present invention relates to a method of manufacturing a projection exposure mask. The mask includes a first mask pattern for exposing a member under exposure to form a continuous pattern thereon and a second mask pattern for exposing the member to form a discontinuous pattern thereon. One of the first and second mask patterns is a reflecting type mask pattern and the other mask pattern is a transmitting type mask pattern.

The method includes the steps of a first step of preparing a transparent substrate having a reflecting film formed on a surface thereof, a second step of applying a resist on the reflecting film and performing exposure and development on the resist to form a shape of a base portion for forming the reflecting type mask pattern and a shape of the transmitting type mask pattern, a third step of applying a resist on the reflecting film having the shape of the base portion and the shape of the transmitting type mask pattern after the development at the second step, performing exposure to form a shape of the reflecting mask pattern on the resist on the base portion, and performing development thereon. The method further includes a fourth step of forming an anti-reflection film on the reflecting film in an area in which the resist is removed at the third step, and a fifth step of removing the resist in the shape of the reflecting type mask pattern left in the development at the third step.

A projection exposure apparatus according to a third aspect of the present invention includes the aforementioned projection exposure mask and an optical system which employs the projection exposure mask to expose a member under exposure to form a continuous pattern and a discontinuous pattern thereon.

A projection exposure apparatus according to a fourth aspect of the present invention includes a projecting exposure mask which includes a first mask pattern for exposing a member under exposure to form a continuous pattern thereon and a second mask pattern for exposing the member to form a discontinuous pattern thereon. One of the first and second mask patterns is a reflecting type mask pattern and the other mask pattern is a transmitting type mask pattern. The apparatus further includes a projection system which projects light from the reflecting type mask pattern and light from the transmitting type mask pattern onto the member, a first illumination system which irradiates light to the reflecting type mask pattern and light from one side of the projection exposure mask, a second illumination system which irradiates light to the transmitting type mask pattern from the opposite side of the one side of the projection exposure mask, and a substrate stage which moves the member in a direction substantially perpendicular to a projection light axis of the projection system.

A method of projection exposure according to a fifth aspect of the present invention includes the steps of preparing the aforementioned projection exposure mask, and exposing a member under exposure to form a continuous pattern and a discontinuous pattern thereon by using the projection exposure mask.

A method of projection exposure according to a sixth aspect of the present invention includes a first step of preparing a projection exposure mask, the projection exposure mask including a first mask pattern for exposing a member under exposure to form a continuous pattern thereon and a second mask pattern for exposing the member to form a discontinuous pattern thereon. One of the first and second mask patterns is a reflecting type mask pattern and the other mask pattern is a transmitting type mask pattern. The method further includes a second step of projecting light from a projection system onto the member by using the projection exposure mask, and a third step of moving the member in a direction substantially perpendicular to a projection light axis of the projection system. The reflecting type mask pattern is irradiated with light from one side of the projection exposure mask and the transmitting type mask pattern is irradiated with light from the opposite side of the one side of the projection exposure mask at the second step.

These and other characteristics of the present invention will be apparent from the following description of specific embodiments with reference to the following.

DETAILED DESCRIPTION OF THE PREFERRED EMBODIMENTS

Embodiment 1

Figure 1:
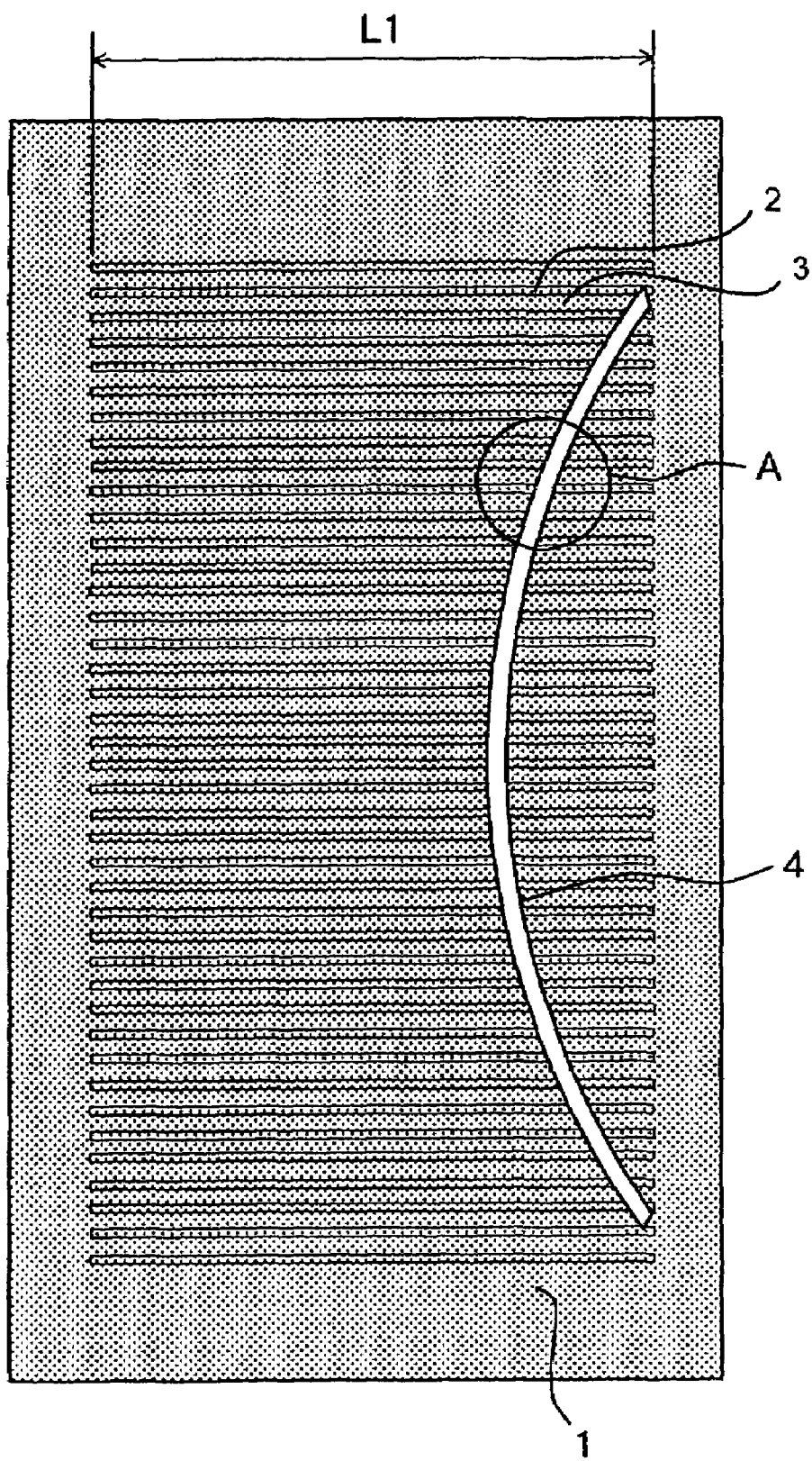
FIG. 1 shows a projection exposure mask, which is Embodiment 1 of the present invention, viewed from the front side.
Figure 2:
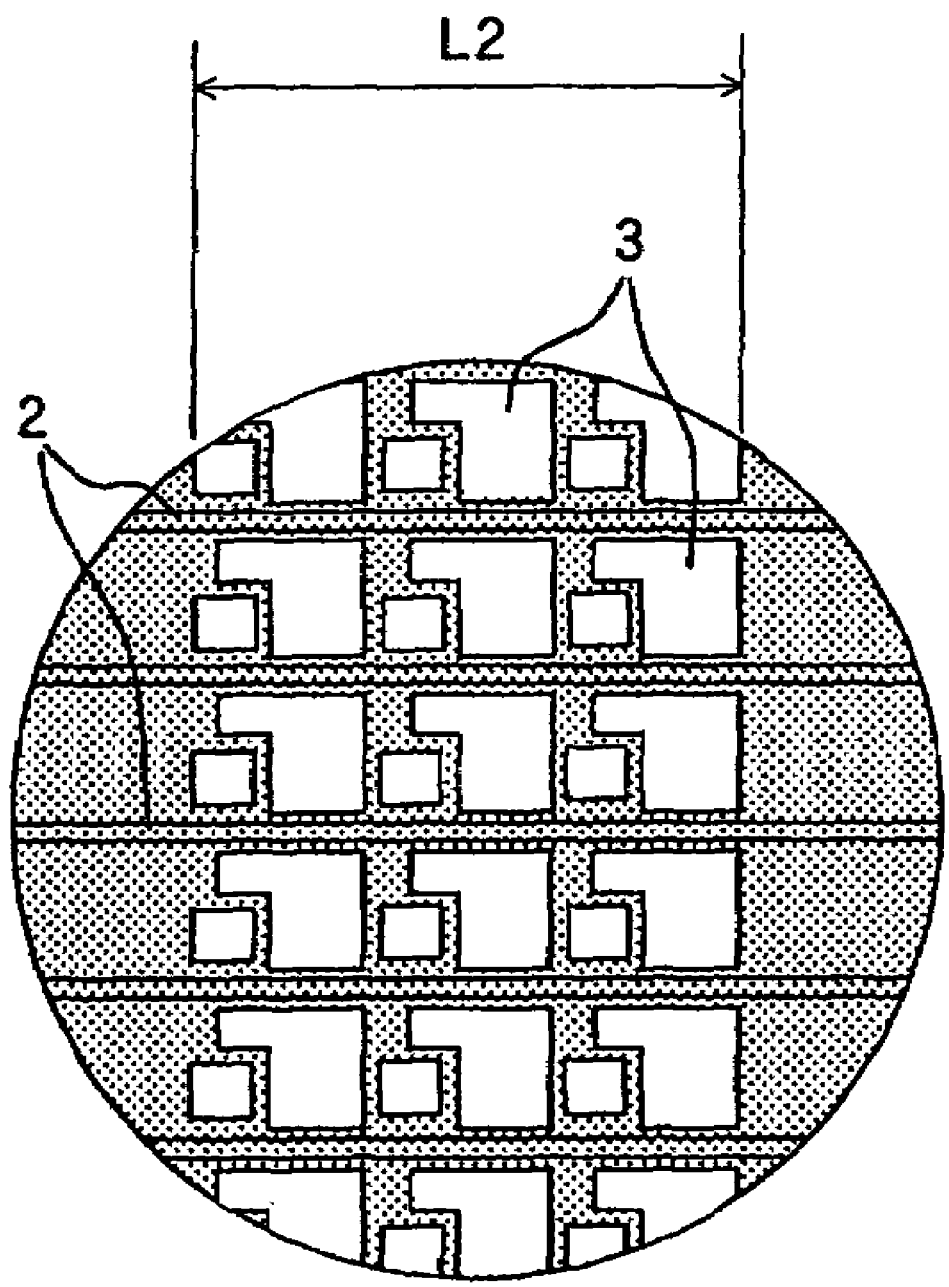
FIG. 2 is an enlarged view of a portion A in FIG. 1.

FIG. 1 shows the structure of a projection exposure mask (the structure of the mask viewed from the front surface side), which is Embodiment 1 of the present invention. FIG. 2 is an enlarged view of a portion A in FIG. 1.

In FIGS. 1 and 2, reference numeral 1 shows the mask. In FIG. 2, reference numeral 2 shows a first mask pattern for exposing a substrate under exposure, not shown in FIGS. 1 and 2, to form a continuous pattern thereon. In Embodiment 1, the first mask pattern 2 is formed as a reflecting type mask pattern which reflects illumination light irradiated from the back surface side of the mask 1 at a high reflectivity. When the substrate is a substrate of a liquid crystal display panel, the continuous pattern corresponds to a gate line, a signal line, or the like.

Reference numeral 3 shows a second mask pattern for exposing the substrate to form a discontinuous cyclic pattern (consisting of isolated repetitive pattern elements) thereon.

The discontinuous cyclic pattern is formed as a transmitting type mask pattern which transmits illumination light irradiated from the front surface side of the mask 1. The discontinuous cyclic pattern includes the individual pattern elements, which are separated from each other without connection and disposed at predetermined intervals. When the substrate is a substrate of a liquid crystal display panel, the discontinuous cyclic pattern corresponds to a pixel pattern, a gate electrode, or the like.

Reference numeral 4 shows an irradiation area (an illumination area) of illumination light to the mask 1. FIG. 1 shows the illumination area in an arc slit-like shape in a projection exposure apparatus of a mirror scan type. For a projection exposure apparatus of a lens scan type, the illumination area has a rectangular (linear) slit-like shape.

As shown in FIG. 2, the pattern elements of the first mask pattern 2 and the pattern elements of the second mask pattern 3 are alternately disposed in the longitudinal direction of the illumination area. In other words, each pattern element of the second mask pattern 3 is disposed between adjacent pattern elements of the first mask pattern 2.

Although not shown clearly in FIG. 2, the second mask pattern 3 is actually arranged in an arc shape in accordance with the illumination area of the arc slit-like shape. When the illumination area has a linear slit-like shape, the second mask pattern 3 is arranged linearly in accordance with the illumination area.

As shown in FIGS. 1 and 2, in Embodiment 1, a length L1 of the first mask pattern 2 is larger to the left than a width L2 of the area in which the second mask pattern 3 is provided. This is an example for improving the use efficiency of light in the projection exposure apparatus, described later in detail. The projection exposure apparatus is used to irradiate illumination light in an arc shape to the left portion of the first mask pattern 2 in FIG. 1, as well, and the resulting reflected light is also used for exposure of the substrate.

FIGS. 3A–3E show a procedure for manufacturing the mask 1 shown in FIG. 1 in a photolithography process.

Figure 3A:
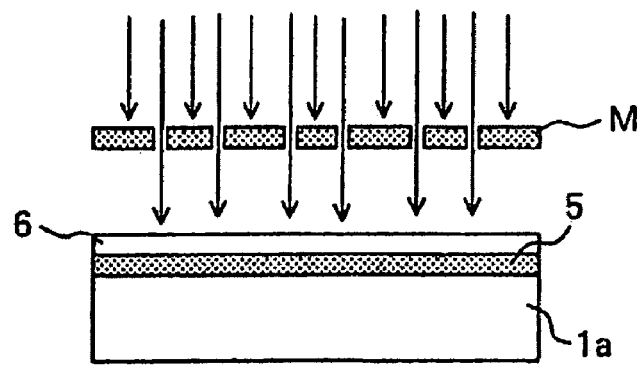
FIGS. 3A–3E are explanatory views of steps for manufacturing the mask shown in FIG. 1.

As shown in FIG. 3A, first, a material (for example, Al, Cu, Au, Ag, or the like) with a high reflectivity for the wavelength of exposure light in the projection exposure apparatus, described later in detail, is evaporated onto a surface of a mask substrate (for example, a glass substrate) 1a, which is substantially transparent to the exposure light, thereby forming a reflecting film 5 (a first step).

Next, a surface of the reflecting film 5 is coated with a photoresist 6. Then, a first mask M for mask manufacture is used to expose the photoresist 6 to form thereon the shape (the image of a base portion serving as a base of the reflecting type first mask pattern 2 and the shape (the image) of the second mask pattern (the transmitting type second mask pattern) 3), and then development and etching are performed (a second step). This step results in base portions 5a of the first mask pattern 3 of the reflecting film 5 (the portions 5b finally become the second mask pattern 3) left on the substrate 1a, as shown in FIG. 3B.

Figure 3B:
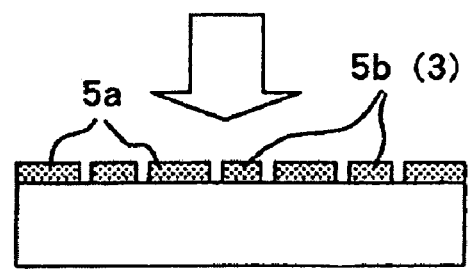
Figure 3C:
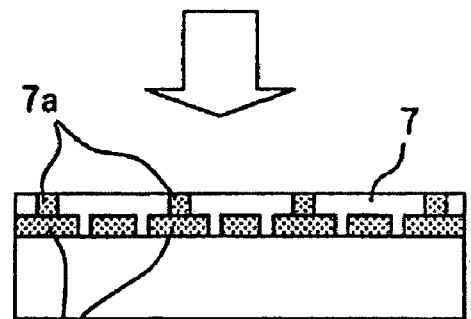
Figure 3D:
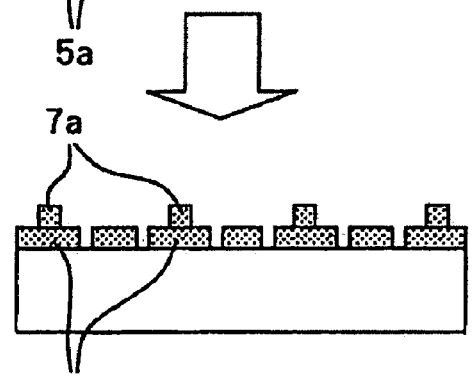

Next, as shown in FIG. 3C, the remaining reflecting film 5 (5a and 5b) is again coated with a photoresist 7. A second mask for mask manufacture, not shown, is used to expose the photoresist 7 to form the shape of the first mask pattern 2 thereon before development (a third step). This step results in photoresists 7a in the shape of the first mask pattern 2 left on the base portions 5a, as shown in FIG. 3D.

Then, an anti-reflection film 8 is evaporated onto reflecting film 5 (5a and 5b), other than the portions on which the photoresists 7a are left and exposed portions of the mask substrate 1a are formed in the state shown in FIG. 3(b) (a fourth step).

Thereafter, the remaining photoresist 7a is removed (a fifth step). With the aforementioned steps, as shown in FIG. 3(e), the mask 1 can be easily manufactured only through the steps for one surface of the mask substrate 1a such that only the first mask pattern 2 formed of the reflecting film is exposed and the other portions including the second mask pattern 3 are coated with the anti-reflection film 8.

Figure 3E:
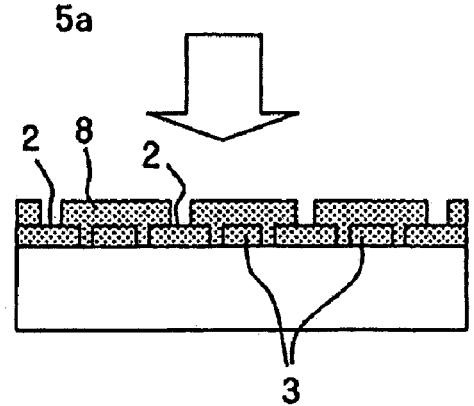

When light is irradiated from above (from the check surface side) in FIG. 3E to the mask 1 manufactured through the aforementioned steps, only part of the light incident on the first mask pattern 2 on which the anti-reflection film 8 is not formed (exposed) is reflected upward at a high reflectivity. In addition, when light is irradiated from below (from the front surface side) in FIG. 3E to the mask substrate 1a and transmitted through the mask substrate 1a, only part of the light transmitted through the portions of the anti-reflection film 8 in contact with the mask substrate 1a (the portions between the reflections films 5a and 5b) travels upward.

Figure 4:
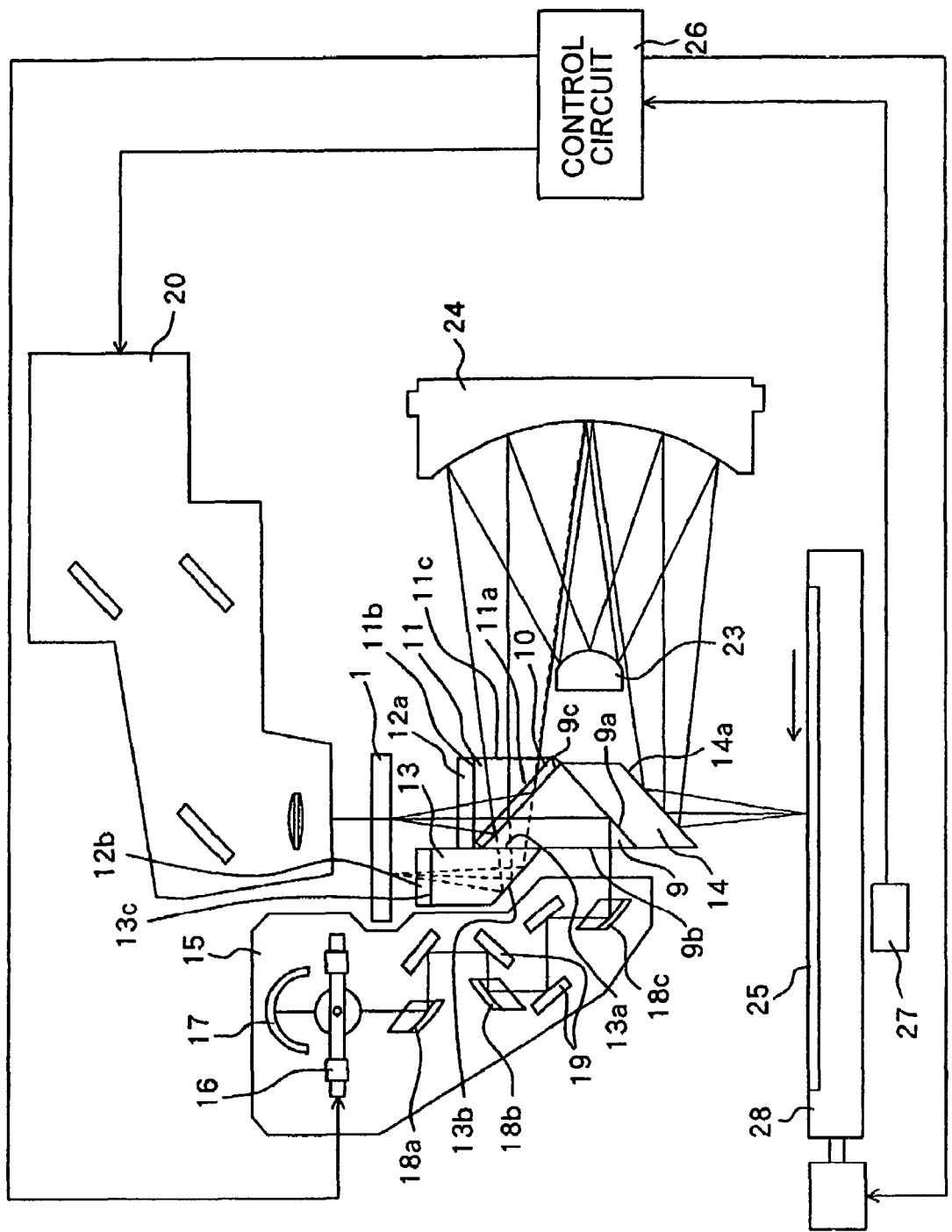
FIG. 4 shows the structure of a projection exposure apparatus which uses the mask shown in FIG. 1.

FIG. 4 shows the mirror scan type projection exposure apparatus which employs the aforementioned mask 1. In FIG. 4, reference numeral 23, 24, and 25 show a convex mirror, a concave mirror, and a substrate under exposure (a substrate for a large-screen liquid crystal display panel).

Reference numeral 9 shows a right-angle prism, which has a reflecting surface 9a and two transmitting surfaces 9b and 9c. The reflecting surface 9a has a reflecting film formed thereon with a high reflectivity for the wavelength of exposure light.

Reference numeral 10 shows a polarization beam splitter, which has a polarized light splitting film formed on a lower transmitting surface cemented to the transmitting surface 9c of the right-angle prism 9.

Reference numeral 11 shows a correction prism for correcting aberration. The correction prism 11 has a transmitting surface 11a cemented to an upper transmitting surface of the polarization beam splitter 10 and two transmitting surfaces 11b and 1c.

Reference numeral 13 shows a light guide element (a prism), which has a transmitting surface 13a cemented to an upper portion of the transmitting surface 9b of the right-angle prism 9, a reflecting surface 13b, and a transmitting surface 13c. The reflecting surface 13b has a reflecting film formed thereon with a high reflectivity for the wavelength of exposure light.

Reference numerals 12a and 12b show one quarter wave plates, which are cemented to the upper transmitting surface 11b of the correction prism 11 and the upper transmitting surface 13c of the light guide prism 13, respectively.

Reference numeral 14 shows a reflecting mirror. A reflecting surface 14a thereof has a reflecting film formed thereon with a high reflectivity for the wavelength of exposure light.

The optical elements from the right-angle prism 9 to the reflecting mirror 14 are cemented to each other and formed as a unit. These optical elements, the convex mirror 23, and the concave mirror 24, constitute a projection system.

Reference numeral 15 shows a first illumination system, which has an extra-high pressure mercury lamp as a light source to continuously illuminate the mask 1. The first illumination system 15 is formed of a light source 16, an elliptical mirror 17, spherical mirrors 18a to 18c, and reflecting mirrors 19.

Reference numeral 20 shows a second illumination system capable of intermittent illumination such as flash illumination or pulse illumination.

Reference numeral 28 shows a substrate stage on which a substrate 25 under exposure, such as a substrate for a liquid crystal display panel or semiconductor substrate, is mounted. The substrate stage 28 is driven in a direction substantially orthogonal to the axis of projection light of the projection system. The position of the substrate stage 28 is measured by a position measuring instrument 27.

Reference numeral 26 shows a control circuit, which controls irradiation operation of illumination light in the first and second illumination systems, driving of the substrate stage 28 for scanning, and the like.

In FIG. 4, after the mask 1 is fixed to a mask set position in the projection exposure apparatus, the first illumination system 15 starts irradiation of illumination light under the control of the control circuit 26.

The light emitted from the light source 16 of the first illumination system 15 is incoherent in terms of time and space. Part of the luminous flux emitted from the light source 16 is reflected by the elliptical mirror 17 to form a secondary light source in the air. Luminous flux from the secondary light source is reflected by the spherical mirrors 18a to 18c to change into slit-like illumination luminous flux with an arc cross section. The plurality of plane mirrors 19 guide the illumination luminous flux to a lower portion of the side transmitting surface 9b of the right-angle prism 9 in the projection system.

The slit-like illumination luminous flux incident on the lower portion of the side transmitting surface 9b of the right-angle prism 9 is reflected by the reflecting surface (the reflecting film) 9a of the right-angle prism 9 in a direction toward the mask 1 (upward). The reflected illumination luminous flux emerges from the transmitting surface 9c of the right angle prism 9 and is separated into S-polarized light and P-polarized light by the polarized light splitting film of the polarization beam splitter 10. Of the S-polarized light and the P-polarized light, polarized light transmitted through the polarized light splitting film is transmitted through the polarization beam splitter 10, the correction prism 11, and the one quarter wave plate 12a, and then irradiated to the back surface of the mask 1 to form a first arc illumination area (which matches the illumination area 4 shown in FIG. 1).

Of the S-polarized light and the P-polarized light, polarized light reflected by the polarized light splitting film of the polarization beam splitter 10 is entered into the light guide prism 13. The light is reflected by the reflecting surface 13b (the reflecting film) of the light guide prism 13, transmitted through the one quarter wave plate 12b, and irradiated to the back surface of the mask 1 to form a second arc illumination area in the left portion of the mask 1 in FIG. 1.

Since the first mask pattern 2 of the mask 1 has a high reflectivity, part of the polarized light forming the two illumination areas on the back surface of the mask 1 are reflected by the first mask pattern 2 and incident on the correction prism 11 and the light guide prism 13 through the one quarter wave plates 12a and 12b, respectively, to return to the polarization beam splitter 10 on the aforementioned optical paths.

Before and after the reflection by the mask 1 (on a go path and a return path), each polarized light passes through the ¼ wave plate 12a or 12b twice, so that each polarization direction is changed ninety degrees from the direction at the time of the reflection by or the transmission through the polarized light splitting film. Thus, the polarized light transmitted through the polarized light splitting film of the polarization beam splitter 10 on the go path is reflected by the polarized light splitting film on the return path. The polarized light reflected by the polarized light splitting film on the go path is transmitted through the polarized light splitting film on the return path.

In this manner, two polarized light fluxes reflected by the first mask pattern 2 are combined to form one luminous flux for exposure. The luminous flux for exposure emerges from the transmitting surface 11c of the correction prism 11 and is incident on an upper portion of the concave mirror 24. The luminous flux for exposure reflected by the upper portion of the concave mirror 24 is reflected by the convex mirror 23, reflected again by a lower portion of the concave mirror 24, reflected by the reflecting surface 14a of the reflecting mirror 14, and projected onto the surface of the substrate 25 disposed at the focus position of the luminous flux. In this manner, the image of the first mask pattern 2 is projected onto the surface of the substrate 25 under exposure, and the substrate 25 is exposed.

The substrate 25 is disposed on the substrate stage 28, which drives the substrate 25 for scanning in a direction substantially orthogonal to the optical axis of the luminous flux for exposure (the axis of the projection light) from the reflecting mirror 14 (in the orthogonal direction to the longitudinal direction of the image of the first mask pattern 2). Since the image of the first mask pattern 2 is continuously projected onto the surface of the substrate 25 during the scan driving, the substrate 25 is exposed to form the continuous pattern thereon with favorable continuity in the scan driving direction.

On the other hand, the second illumination system 20 controlled by the control circuit 26 irradiates luminous flux for arc flash illumination or luminous flux for pulse illumination to the surface of the mask 1 each time the substrate 25 is driven for scanning by a predetermined amount. Thus, the illumination area shown by the reference numeral 4 in FIG. 1 is formed.

For the second illumination system 20, it is preferable to use a light source capable of producing linearly polarized light and performing pulse irradiation such as an excimer laser. It is also preferable that an extra-high pressure mercury lamp is used as a light source, illumination light can be intermittently irradiated at a high speed by using an EO element or a deflection mirror and a high speed shutter combination, and a polarizing plate is provided in the second illumination system 20 to change the illumination light to linearly polarized light.

Of the illumination luminous flux (linearly polarized light) irradiated to the surface of the mask 1, luminous flux for exposure transmitted through the second mask pattern 3 is transmitted through the one quarter wave plate 12a and the correction prims 11, incident on the polarization beam splitter 10, and then reflected by the polarized light splitting film of the polarization beam splitter 10.

The luminous flux for exposure from the second mask pattern 2 reflected by the polarized light splitting film is projected onto the surface of the substrate 25 disposed at the focus position of the luminous flux through the transmitting surface 11c of the correction prism 11, via an upper portion of the concave mirror 24, the convex mirror 23, a lower portion of the concave mirror 24, and the reflecting surface 14a of the reflecting mirror 14.

Figure 5:
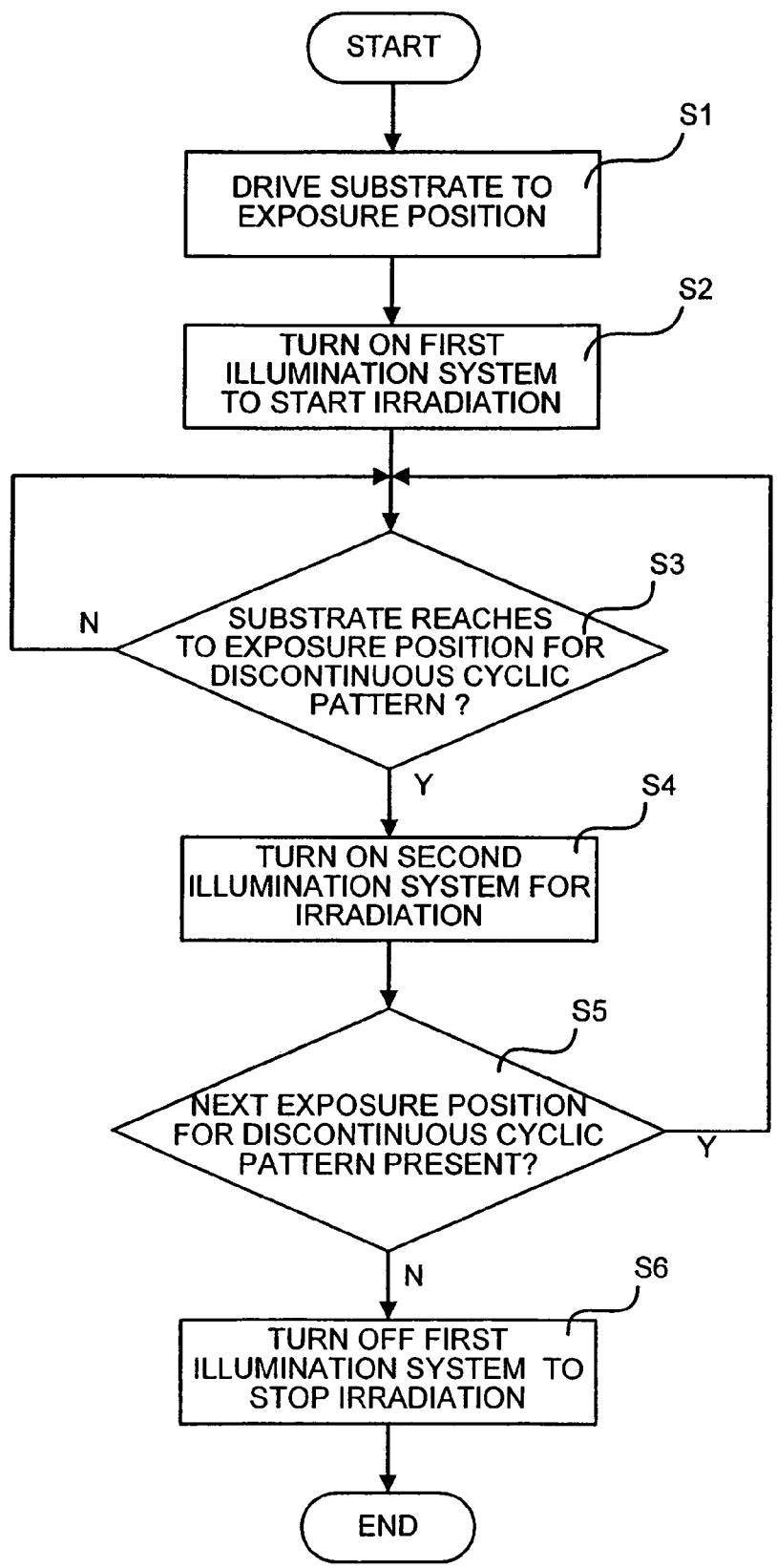
FIG. 5 is a flow chart for explaining exposure control in the projection exposure apparatus shown in FIG. 4.

FIG. 5 is a flow chart showing a method of controlling exposure in the projection exposure apparatus (mainly by the control circuit 26) in Embodiment 1.

First, the control circuit 26 starts the driving of the substrate stage 28 for scanning. The driving position of the substrate 25 (the substrate stage 28) is always measured by the position measuring instrument 27. The control circuit 26 controls the substrate stage 28 based on the measurement results.

When arc slit-like illumination light is used for scanning, a conjugate surface, not shown, to the mask 1 is formed in the first illumination system 15 and a masking blade is provided on the conjugate surface to provide illumination timing for the first mask pattern 2 to align the continuous pattern on the substrate 25. The same applies to the second illumination system 20.

After the exposure start target position on the substrate 25 matches the projection position (exposure position) of the first mask pattern image at step (abbreviated as "S" in FIG. 5) 1, the control circuit 26 operates (turns on) the first illumination system 15 for illumination to irradiate the illumination light to the first mask pattern 2 at step 2. This starts exposing the substrate 25 to form the continuous pattern thereon. The control circuit 26 continues the scan driving of the substrate stage 28 at a constant speed.

Next, at step 3, the control circuit 26 determines whether the substrate 25 reaches the projection position (exposure position) of the second mask pattern image based on the measurement results of the position measuring instrument 27. When the projection position of the second mask pattern image is reached, the control circuit 26 operates (turns on) the second illumination system 20 for illumination to irradiate the illumination light to the second mask pattern 3 at step 4. This causes exposure of the substrate 25 to form the discontinuous cyclic pattern 25b thereon.

Next, the control circuit 26 determines whether the number of exposures for the discontinuous cyclic pattern reaches the target number (whether a pattern element of the discontinuous cyclic pattern for the next exposure remains) at step 5. This is achieved by determining whether the value of a counter incremented each time exposure for each pattern element of the discontinuous cyclic pattern is performed reaches the target exposure number for the discontinuous cyclic pattern previously input through an input manipulation section, or the like, of the projection exposure apparatus.

When a pattern element of the discontinuous cyclic pattern for the next exposure remains at step 5, the flow returns to step 3 where the control circuit 26 again operates (turns on) the light source of the second illumination system 20 for illumination to irradiate illumination light to the second mask pattern 3 from the time when the exposure position of the next pattern element of the discontinuous cyclic pattern on the substrate 25 reaches the projection position of the second mask pattern 3. This causes exposure of the substrate 25 to form the next pattern element of the discontinuous cyclic pattern thereon. During this exposure, the first illumination system 15 continues to irradiate the illumination light to the first mask pattern 2, and the substrate 25 is exposed to form the continuous pattern thereon.

The exposure for the discontinuous cyclic pattern is repeated in this manner. Finally, when a pattern element of the discontinuous cyclic pattern for the next exposure does not remain at step 5, the flow proceeds to step 6 where the control circuit 26 turns off the light source of the first illumination system 15 to terminate the exposure of the substrate 25 for forming the continuous pattern and the discontinuous cyclic pattern thereon as a series of exposure steps (as a single process).

With the steps described above, the exposure of the substrate 25 to form the continuous pattern and the discontinuous cyclic pattern thereon can be completed through a series of exposure steps (as a single process).

In Embodiment 1, the mask 1 is fixedly supported at the mask set position in the projection exposure apparatus as described above and is not driven for scanning as the substrate 25. It is thus possible to reduce the length of the mask 1 in the scan driving direction of the substrate 25. Consequently, the mask 1 involves little deformation due to its own weight even when the mask 1 is supported at its peripheral areas (outside the area where the mask patterns 2 and 3 are formed). This allows the margin of the focal depth of the projection system to be provided on the side of the image plane (the manufacturing margin, such as flatness, of the substrate 25) to realize the exposure of the substrate with high reliability.

Figure 6:
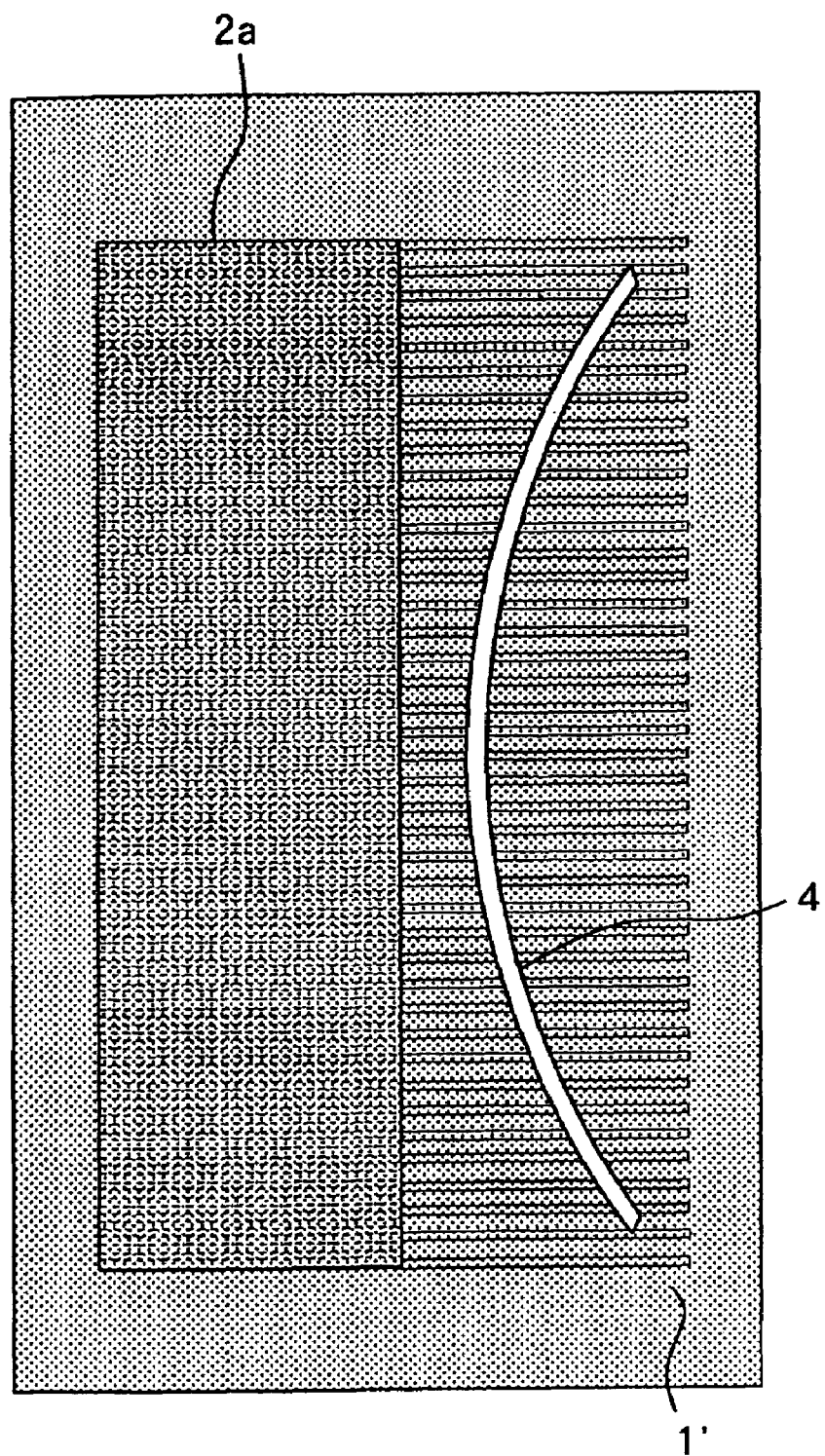
FIG. 6 shows a mask provided by adding a fine mask pattern to the mask shown in FIG. 1 and viewed from the front side.

FIG. 6 shows a variation of the aforementioned mask. In a mask 1' shown in FIG. 5, a third mask pattern 2a of a reflecting type is formed at a high frequency close to the resolution limit of a projection system (in other words, for exposure to form a fine pattern having the minimum pattern width smaller than the minimum pattern width of the first mask pattern 2) in an area to which the illumination light from the first illumination system 15 is irradiated through the light guide prism 13, within the area (the left portion in FIG. 6) where only the first mask pattern 2 is formed in the mask 1 shown in FIG. 1.

This mask is provided for realizing so-called multiple exposure (see, for example, Japanese Patent application Laid-Open No. 2000-91221, which corresponds to U.S. Published Patent Application No. 2002/0187440) by the projection exposure apparatus shown in FIG. 4.

This mask can be used to complete exposure with a series of exposure steps (with a single process) as compared with two exposure processes needed in a conventional multiple exposure procedure. In addition, the mask pattern for exposure to form the fine pattern and the mask pattern for exposure to form the discontinuous cyclic pattern are separately formed as the reflecting type and the transmitting type on the mask 1' to allow improvement in exposure profiles of the discontinuous cyclic pattern, thereby effectively supporting an increased number of pixels and improving yields of a substrate for a liquid crystal display panel.

Embodiment 2

Figure 7:
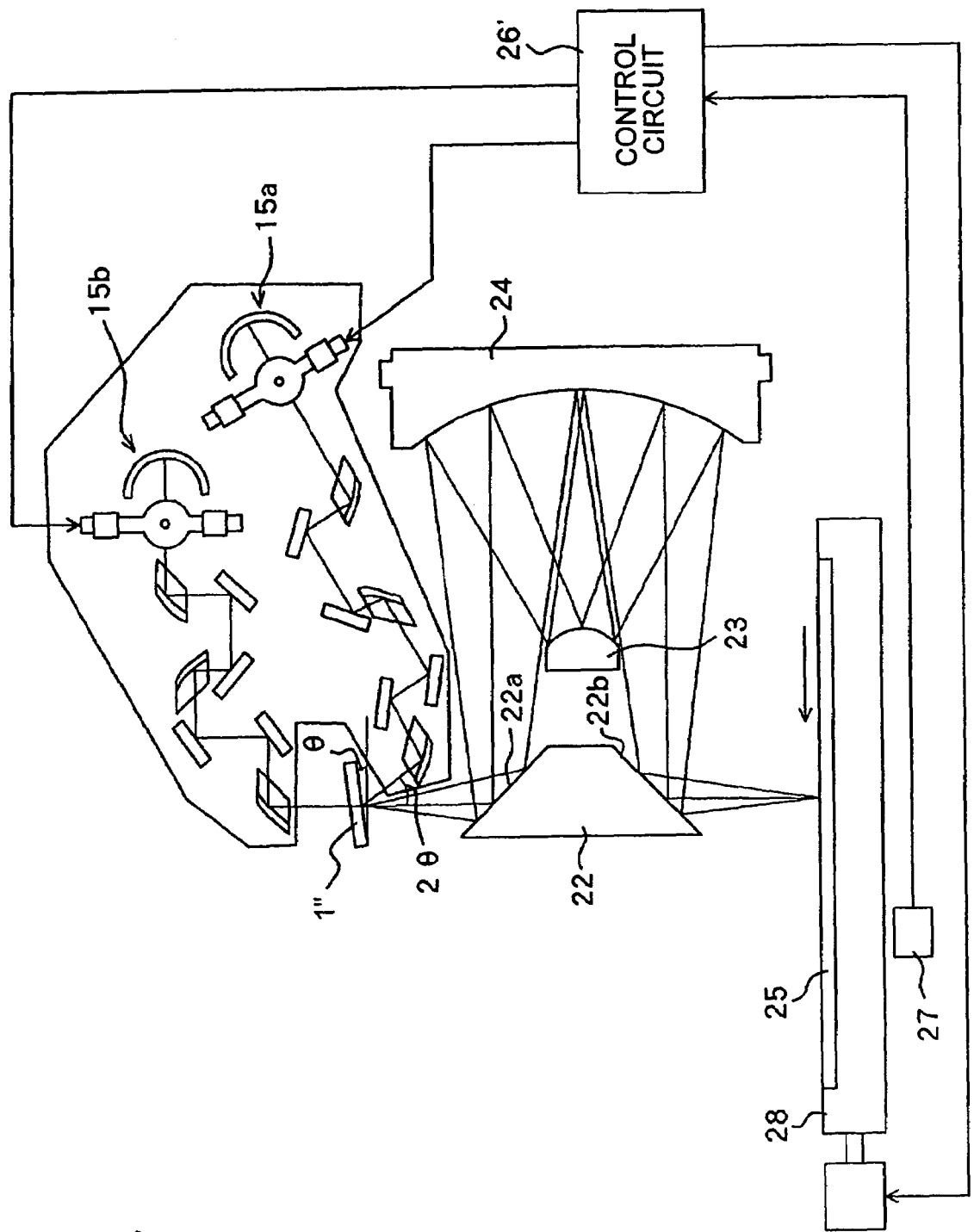
FIG. 7 shows the structure of a projection exposure apparatus, which is Embodiment 2 of the present invention.

FIG. 7 shows the structure of a projection exposure apparatus, which is Embodiment 2 of the present invention. Embodiment 1 has been described for the case in which the illumination light from the first illumination system is guided to the first mask pattern (the reflecting type mask pattern) of the mask by using part of the projection system. In Embodiment 2, however, illumination light from a first illumination system is guided to a first mask pattern of a mask from outside a projection system.

It should be noted that, in Embodiment 2, components identical to those in Embodiment 1 are designated with the same reference numerals as those in Embodiment 1.

In FIG. 7, reference numeral 1" shows a mask, which has a first mask pattern of a reflecting type and a second mask pattern of a transmitting type, similar to the mask 1 described in Embodiment 1. However, the mask 1" of Embodiment 2 does not have an area where the first mask pattern extends longer than the second mask pattern as the mask 1 shown in FIG. 1, and has only a portion corresponding to the right portion of the mask 1 in FIG. 1 (the portion in which the illumination area 4 is formed).

In FIG. 7, reference numeral 15a shows a first illumination system, which has an extra-high pressure mercury lamp as a light source and illuminates the first mask pattern of the mask 1" from the side of the projection system. The first illumination system 15a is formed of components similar to those of the first illumination system of Embodiment 1. Reference numeral 15b shows a second illumination system, which has an extra-high pressure mercury lamp as a light source and illuminates the second mask pattern of the mask 1" from the opposite side of the mask 1" to the projection system. The second illumination system 15b is formed of components similar to those of the first illumination system 15a. The first and second illumination systems 15a and 15b are controlled for irradiation by a control circuit 26'.

Reference numeral 22 shows a reflecting member, which has a reflecting surface 22a for reflecting exposure light from the mask 1" to an upper portion of a concave mirror 24 and a reflecting surface 22b for reflecting exposure light incident from the upper portion of the concave mirror 24 via a convex mirror 23 and a lower portion of the concave mirror 24 to project the light onto a substrate 25 under exposure.

Embodiment 2 has the projection system substantially similar to a conventionally used slit-like scan exposure apparatus of a mirror reflecting type, and the mask 1" is disposed to form an angle θ with respect to a surface orthogonal to the illumination light axis of the second illumination system 15b, which matches the incident and projection light axis of the projection system. This allows the illumination light from the first illumination system 15a to be irradiated readily to the mask 1" from outside the projection system to simplify the structure of the projection system.

The illumination light axis of the first illumination system 15a intersects the optical axis of the projection system at the position of an object point to form a predetermined angle 2θ. The angle θ of inclination of the mask 1 is set to be half of the angle 2θ, which is formed between the illumination light axis of the first illumination system 15a and the incident light axis of the projection system.

The angle θ of inclination of the mask 1" is a small angle, which does not interfere with the margin of the focal depth of the projection system.

In Embodiment 2, the control circuit 26' drives a substrate stage 28, on which the substrate 25 is mounted, in a step-and-repeat manner. Each time the substrate stage 28 stops, the control circuit 26' makes the first and second illumination systems 15a and 15b irradiate illumination light to the mask 1". According to Embodiment 2, the exposure time, especially for a discontinuous cyclic pattern, can be easily ensured. In addition, in Embodiment 2, the substrate 25 can be exposed to form the continuous pattern and the discontinuous cyclic pattern thereon from separate exposure areas with a series of exposure steps (with a single process), similar to Embodiment 1.

Embodiment 3

Figure 8:
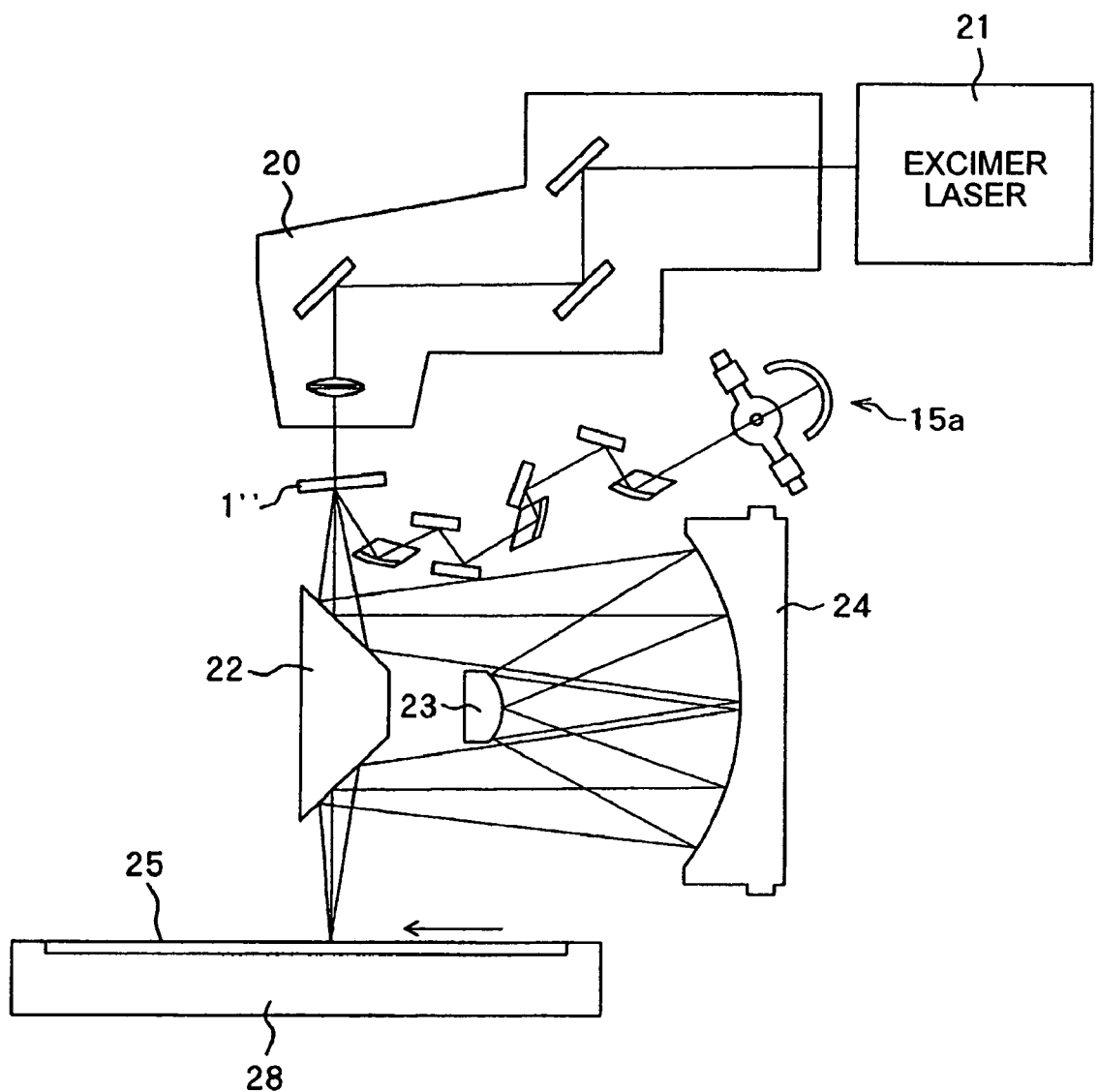
FIG. 8 shows the structure of a projection exposure apparatus, which is Embodiment 3 of the present invention.

FIG. 8 shows the structure of a projection exposure apparatus, which is Embodiment 3 of the present invention. Embodiment 3 employs a second illumination system, which uses an excimer laser 21, such as an ArF excimer laser, as a light source, instead of the second illumination system 15b of the projection exposure apparatus in Embodiment 2. It should be noted that, in Embodiment 3, components identical to those in Embodiment 2 are designated with the same reference numerals as those in Embodiment 2.

In Embodiment 3, a control circuit, not shown, drives a substrate stage 28 on which a substrate 25 under exposure is mounted in a step-and-repeat manner. Each time the substrate stage 28 stops, the control circuit (not shown in FIG. 8) makes a first illumination system 15a and a second illumination system 20 irradiate illumination light to a mask 1".

In Embodiment 3, since the excimer laser, which produces illumination light at a shorter wavelength is used as the light source of the second illumination system 20, the resolution in exposure for a discontinuous cyclic pattern can be improved as compared with Embodiment 2, which employs the extra-high pressure mercury lamp as the light source even with the same numerical aperture (NA) of the projection system.

Embodiment 4

Figure 9:
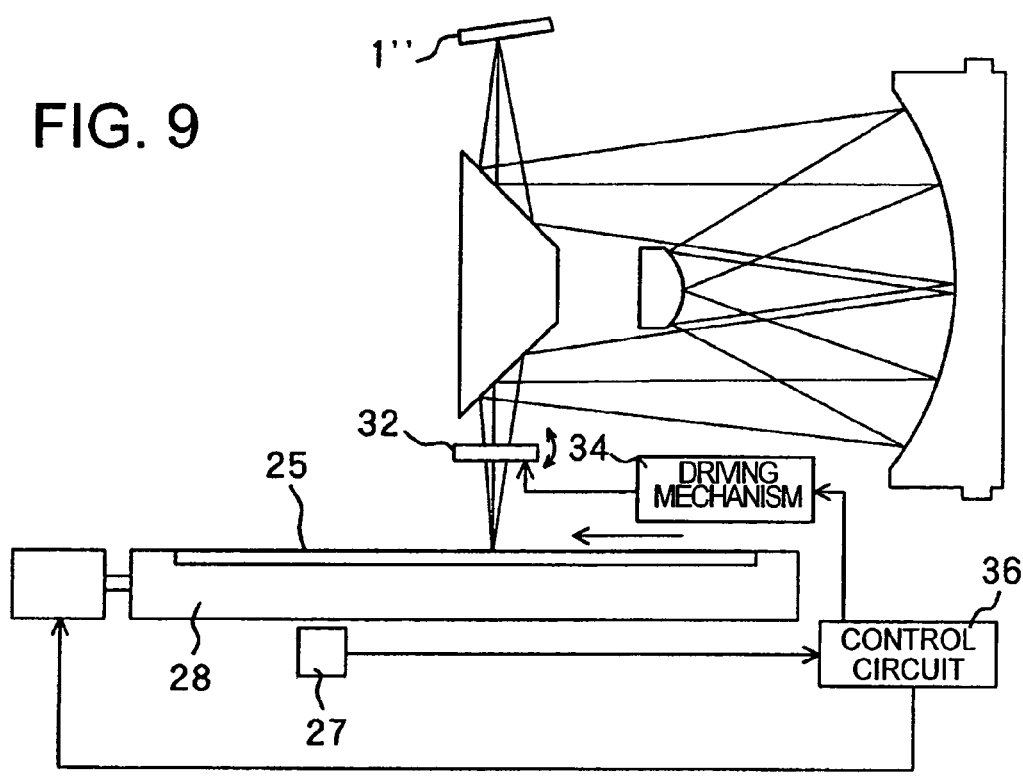
FIG. 9 shows the structure of a projection exposure apparatus, which is Embodiment 4 of the present invention.
Figure 10:
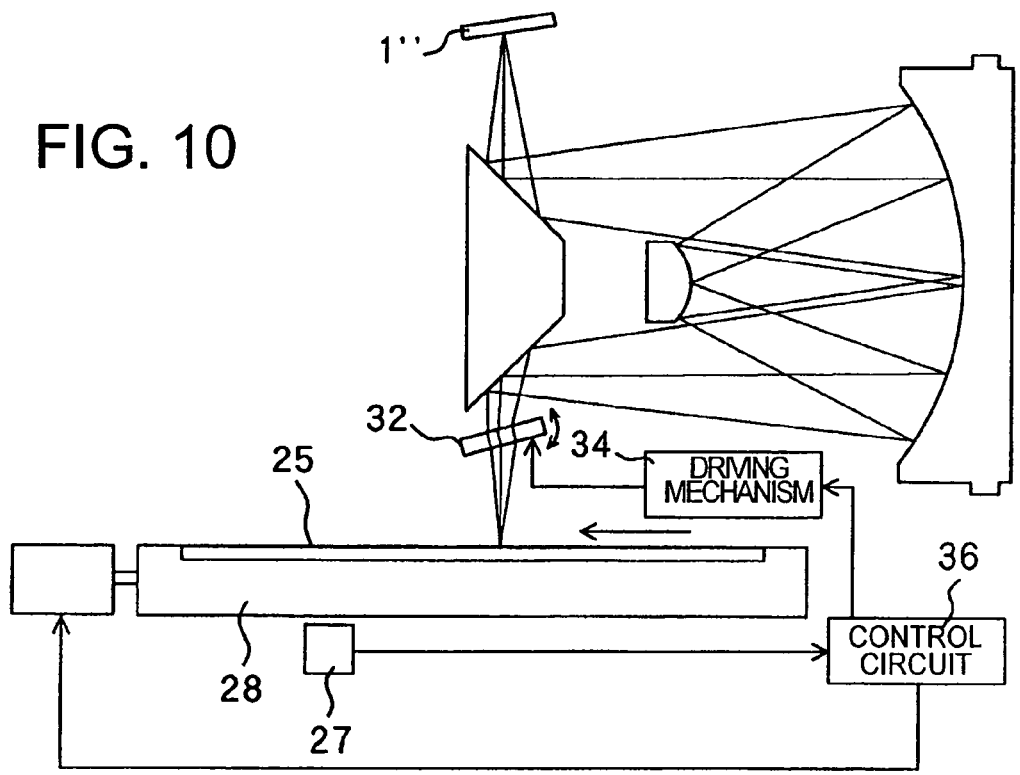
FIG. 10 shows the structure of the projection exposure apparatus shown in FIG. 9.

FIGS. 9 and 10 show the structure of a projection system in a projection exposure apparatus, which is Embodiment 4 of the present invention. Embodiments 2 and 3 have been described for the case in which the substrate 25 is driven in a step-and-repeat manner and thus exposed sequentially to form the continuous pattern and the discontinuous cyclic pattern thereon. In addition, it is possible that each of the projection systems of Embodiments 2 and 3 is used to perform the exposure of the substrate 25 to form the continuous pattern and the discontinuous cyclic pattern thereon while the substrate 25 is driven for scanning as described in Embodiment 1.

The scan type projection exposure apparatus originally has a main purpose of increasing the scan driving speed as much as possible to improve yields. However, as the scan driving speed of the substrate under exposure is increased, it becomes difficult to ensure the exposure time for the discontinuous cyclic pattern. To address this, Embodiment 4 shows the projection exposure apparatus in which the exposure time for the discontinuous cyclic pattern can be ensured even when the scan driving speed of the substrate under exposure is increased.

A projection system shown in Embodiment 4 is provided by adding a swingable parallel plate 32 unique to Embodiment 4 to the projection system as described in Embodiments 2 and 3. Similar to Embodiments 2 and 3, first and second illumination systems can also be provided in Embodiment 4, but they are omitted in FIGS. 9 and 10. It is also possible that the parallel plate 32 is provided for the projection system described in Embodiment 1.

The parallel plate 32 is formed of a material substantially transparent to exposure light (with a high transmittance), and driven for swinging by a driving mechanism 34 including a driving circuit at a speed corresponding to a speed of scan driving of the substrate 25 in a direction of the scan driving. The driving mechanism 34 is controlled by a control circuit 36, which also controls light sources of the first and second illumination systems, not shown, and scan driving of a substrate stage 28.

To reliably achieve intermittent exposure of the substrate 25 for forming a discontinuous cyclic pattern thereon, it is necessary to ensure an optimal exposure time during each intermittent exposure. Thus, in Embodiment 4, the scan driving speed of the substrate 25 is increased to improve throughput, and, in addition, the image of a second mask pattern of the mask 1" can be held at the same position on the substrate 25 for a required exposure time to ensure an exposure time required in exposure for the discontinuous cyclic pattern during the scan driving.

Specifically, the parallel plate 32 is swung such that the image of the second mask pattern moves in the scan driving direction at the speed equal to the scan driving speed of the substrate 25. This allows the image of the second mask pattern to be held at the same position on the substrate 25 during the swinging of the parallel plate 32 in the direction described above to ensure the exposure time required in exposure for the discontinuous cyclic pattern.

However, the image of a first mask pattern for forming the image of a continuous pattern through exposure is also held at the same position on the substrate 25 during the exposure for the discontinuous cyclic pattern because of the swinging of the parallel plate 32. Thus, the continuity of the continuous pattern is reduced. In Embodiment 4, the disadvantage is eliminated by an exposure method described below.

Figure 11:
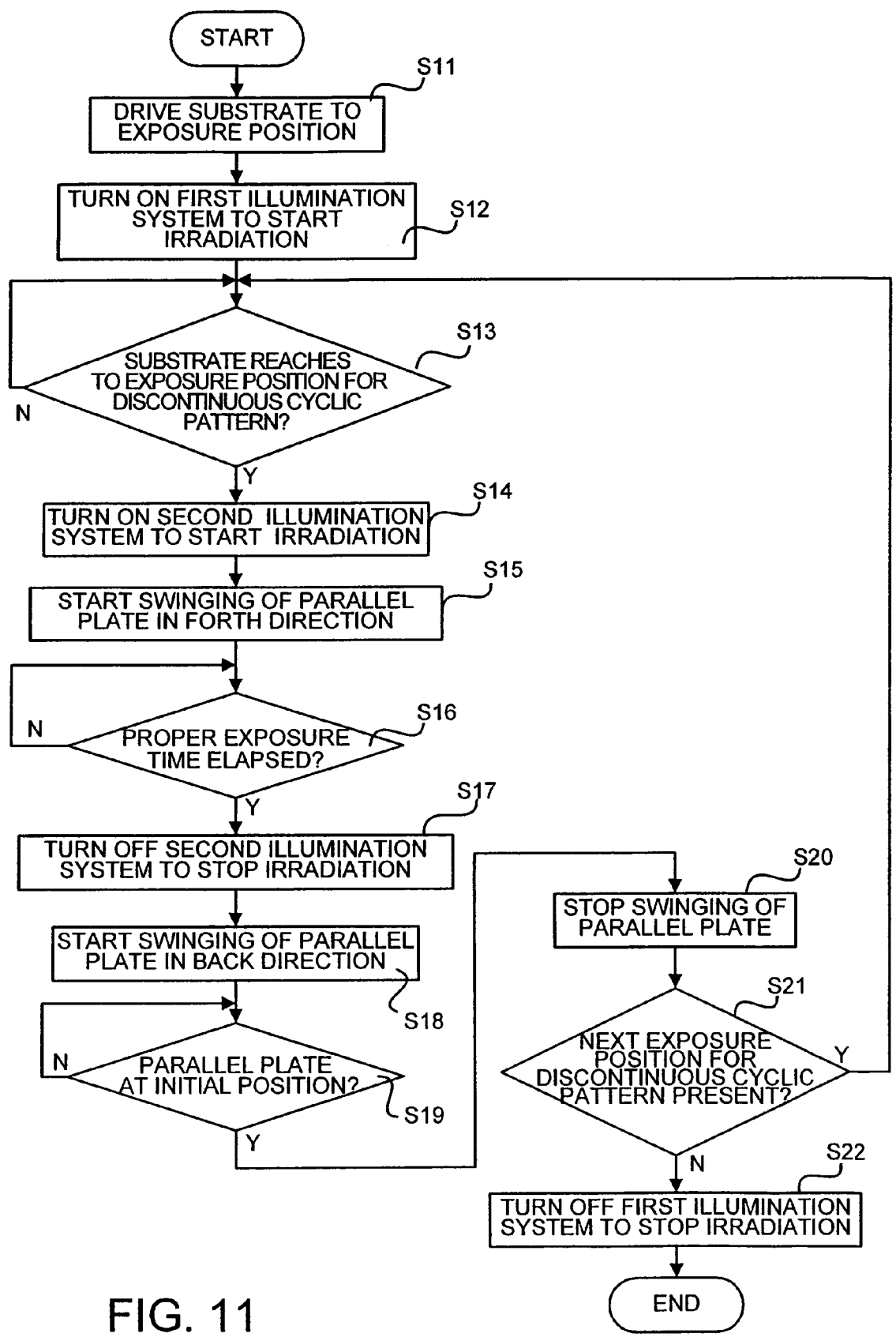
FIG. 11 is a flow chart for explaining exposure control in the projection expose apparatus shown in FIG. 9.
Figure 12:
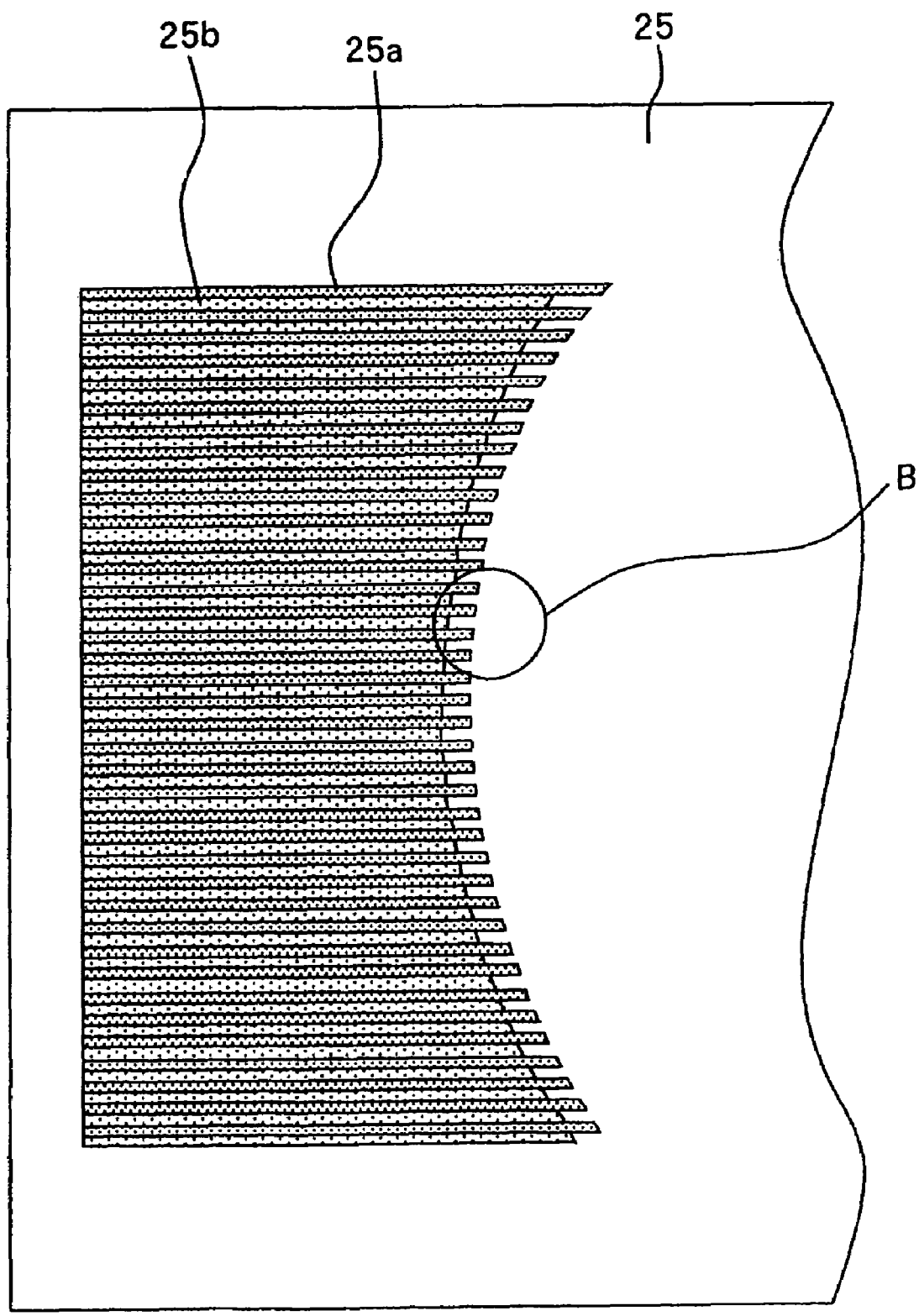
FIG. 12 shows a substrate under exposure which is being subjected to patterning through exposure by the projection exposure apparatus shown in FIG. 9.
Figure 13:
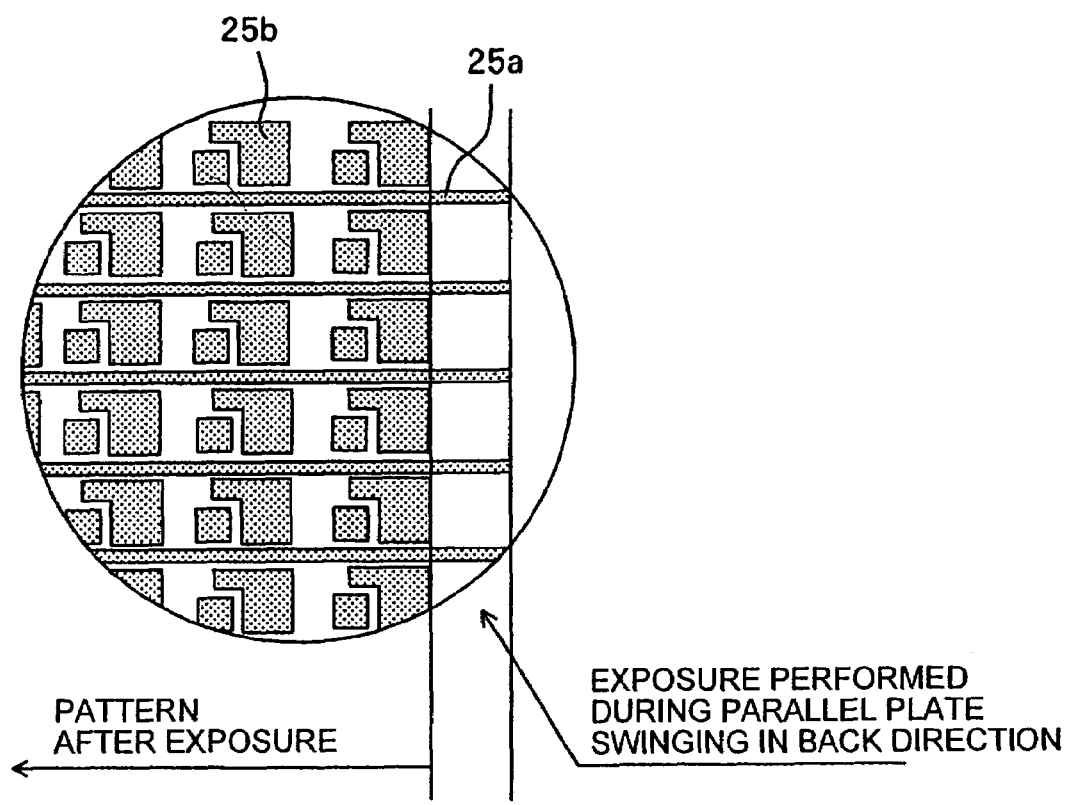
FIG. 13 is an enlarged view of a portion B in FIG. 12.

FIG. 11 is a flow chart showing a method of controlling exposure in the projection exposure apparatus (mainly by the control circuit 36) in Embodiment 4. FIGS. 12 and 13 show the substrate 25, which is being exposed to form the pattern thereon with the exposure control method.

The control circuit 36 first starts driving of the substrate stage 28 for scanning. The driving position of the substrate 25 (the substrate stage 28) is always measured by a position measuring instrument 27. The control circuit 36 controls the substrate stage 28 based on the measurement results.

When arc slit-like illumination flux is used for scanning, a conjugate surface, not shown, to the mask 1" is formed in the first illumination system and a masking blade is provided on the conjugate surface to provide illumination timing for the first mask pattern 2 to align the continuous pattern on the substrate 25. The same applies to the second illumination system.

After the exposure start target position on the substrate 25 matches the projection position (exposure position) of the first mask pattern image at step (abbreviated as "S" in FIG. 11) 11, the control circuit 36 operates (turns on) the first illumination system for illumination to irradiate the illumination light to the first mask pattern at step 12. This starts exposure of the substrate 25 to form the continuous pattern 25a thereon, as shown in FIG. 12. The control circuit 36 continues the driving of the substrate stage 28 for scanning at a constant speed.

Next, at step 13, the control circuit 36 determines whether the substrate 25 reaches the projection position (exposure position) of the second mask pattern image based on the measurement results of the position measuring instrument 27. When the projection position of the second mask pattern image is reached, the control circuit 36 operates (turns on) the second illumination system for illumination to irradiate the illumination light to the second mask pattern at step 14. This causes exposure of the substrate 25 to form the discontinuous cyclic pattern 25b thereon, as shown in FIG. 13.

Then, in accordance with the exposure start timing of the discontinuous cyclic pattern, the control circuit 36 causes the parallel plate 32 to start swinging in a forth (i.e., the forward) direction (in the same direction as the scan driving direction of the substrate 25) from the initial position at step 15. When the parallel plate 32 is swung in the forth direction, the image of both of the mark patterns can be moved in the forth direction of the swinging while the incident angle of the projection luminous flux on the substrate 25 is maintained by a thickness t, a refractive index n, an exposure light wavelength λ, and a change of a swinging angle θ of the parallel plate 32. The swinging speed of the parallel plate 32 in the forth direction is controlled such that the projection positions of the images of both mask patterns onto the substrate 25 are held fixedly during the scan driving, and the swinging of the parallel plate 32 in the forth direction is performed during the required exposure time for the discontinuous cyclic pattern. Consequently, the proper exposure time for the discontinuous cyclic pattern on the substrate 25, which is being driven for scanning, is ensured.

The control circuit 36 determines whether the swinging time of the parallel plate 32 in the forward direction (corresponding to the exposure time for the discontinuous cyclic pattern) reaches the required exposure time at step 16. When the required exposure time is reached, the control circuit 36 stops the irradiation of the illumination light from the second illumination system at step 17, and makes the parallel plate 32 swing in a back direction toward the original position (the initial position) at step 18. During the swinging in the back direction, the first illumination system continues to irradiate the illumination light to the first mask pattern (that is, exposure of the substrate 25 to form the continuous pattern thereon) is continued. This causes the first mask pattern image to be moved on the substrate 25 in the opposite direction to the scan driving direction, thereby extending the continuous pattern formed on the substrate 25 to the position where exposure for the continuous pattern is next started together with the discontinuous cyclic pattern. Thus, the continuity of the continuous pattern is ensured.

The swinging of the parallel plate 32 in the back direction is completed before the exposure position of the next pattern element of the discontinuous cyclic pattern on the substrate 25 reaches the projection position of the second mask pattern when the parallel plate 32 is at the initial position. After it is found that the parallel plate 32 returns to the initial position at step 19, the control circuit 36 stops the swinging of the parallel plate 32 in the back direction at step 20.

At step 21, the control circuit 36 determines whether the number of expenses for the discontinuous cyclic pattern reaches the target number (whether a pattern element of the discontinuous cyclic pattern for the next exposure remains). This is achieved by determining whether the value of a counter incremented each time exposure for each pattern element of the discontinuous cyclic pattern is performed reaches the target exposure number for the discontinuous cyclic pattern previously input through an input manipulation section, or the like, of the projection exposure apparatus.

When a pattern element of the discontinuous cyclic pattern for the next exposure remains at step 21, the flow returns to step 13, where the control circuit 36 again operates (turns on) the light source of the second illumination system for irradiation, to irradiate illumination light to the second mask pattern from the time when the exposure position of the next pattern element of the discontinuous cyclic pattern on the substrate 25 reaches the projection position of the second mask pattern when the parallel plate 32 is at the initial position, and starts swinging the parallel plate 32 in the forth direction (steps 14 and 15). This starts exposure of the substrate 25 to form the next pattern element of the discontinuous cyclic pattern and the continuous pattern thereon. In addition, when the swinging time of the parallel plate 32 in the forth direction reaches the required exposure time (step 16), the control circuit 36 turns off the light source of the second illumination system (step 17), and makes the parallel plate 32 swing in the back direction to the initial position (step 18). During this swinging, the first illumination system continues to irradiate the illumination light to the first mask pattern, that is, the exposure for the continuous pattern is continued.

Then, when a pattern element of the discontinuous cyclic pattern for the next exposure does not remain at step 21, the flow proceeds to step 22 in which the control circuit 36 turns off the light source of the first illumination system to terminate the exposure of the substrate 25 for forming the continuous pattern thereon. By these steps, the exposure of the continuous pattern and the discontinuous cyclic pattern on the substrate 25 as a series of exposure steps (as a single process) is finished.

FIGS. 12 and 13 (FIG. 13 is an enlarged view of a portion B in FIG. 12) show the mask during the exposure process described above up to step 20.

In FIGS. 12 and 13, a plurality of pattern elements of the discontinuous cyclic pattern after exposure on the substrate 25 are shown by reference numeral 25*b*. Portions of a continuous pattern 25*a* after exposure, which extend to the right in FIG. 13 (in the opposite direction to the scan driving direction of the substrate 25) from the plurality of pattern elements of the discontinuous cyclic pattern 25*b* after exposure, have been exposed during the swinging of the parallel plate 32 in the back direction at steps 18 to 20. The continuity of the continuous pattern 25*a* is ensured by performing exposure for the continuous pattern 25*a* during the swinging of the parallel plate 32 in the forth direction to connect to the extending portions of the continuous pattern 25*a*.

Embodiment 5

Figure 14:
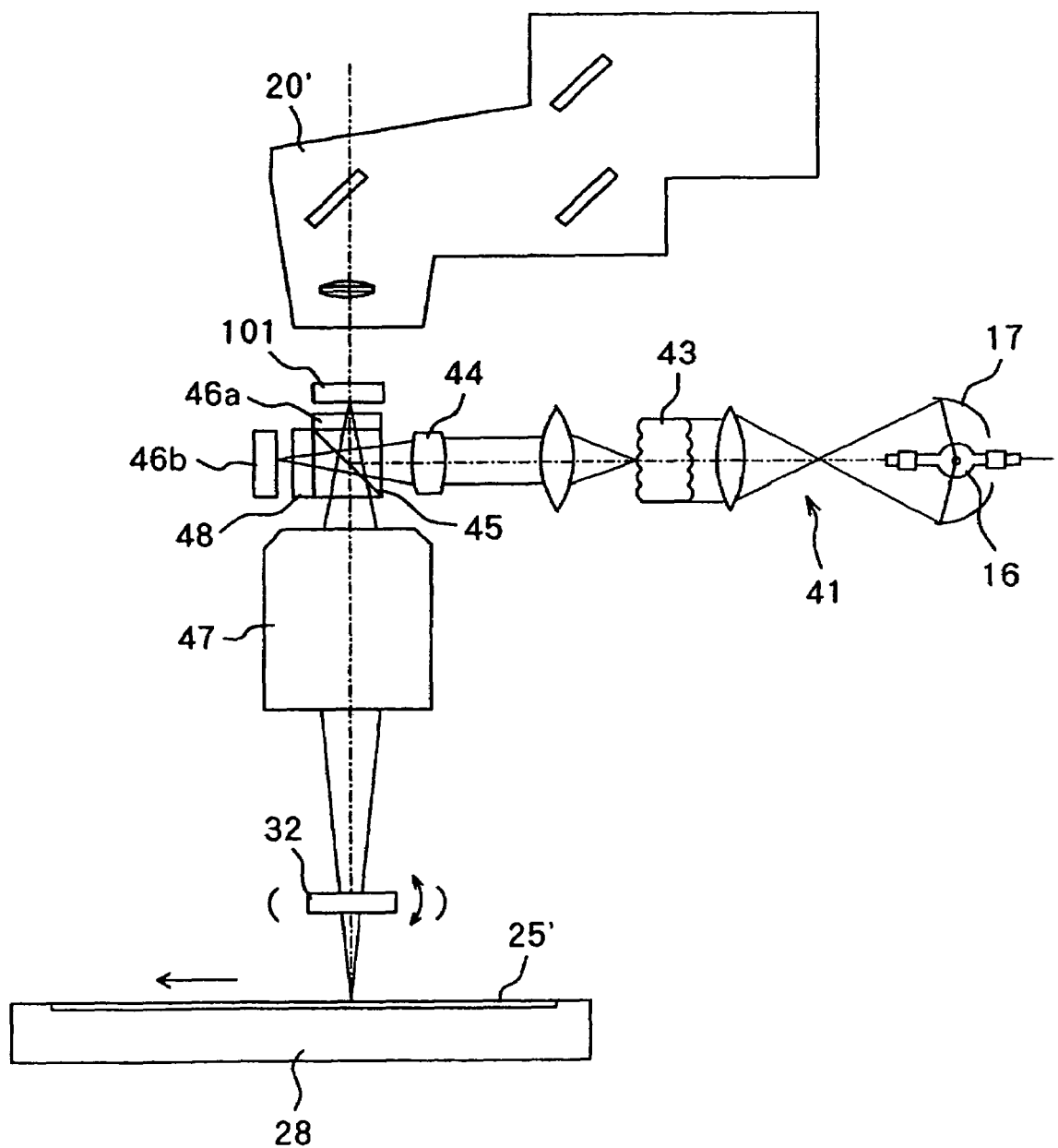
FIG. 14 shows the structure of a projection exposure apparatus, which is Embodiment 5 of the present invention.

FIG. 14 shows the structure of a projection exposure apparatus, which is Embodiment 5 of the present invention. While the reflecting projection system is used in each of Embodiments 1 to 4, a lens projection system is used in Embodiment 5. Specifically, the mask including the reflecting type mask pattern and the transmitting type mask pattern according to the present invention can be used not only in the projection exposure apparatus having the reflecting projection system, but also in the projection exposure apparatus having the lens projection system.

It should be noted that, in Embodiment 5, components identical to those in Embodiments 1 to 4 are designated with the same reference numerals as those in Embodiments 1 to 4.

Figure 15:
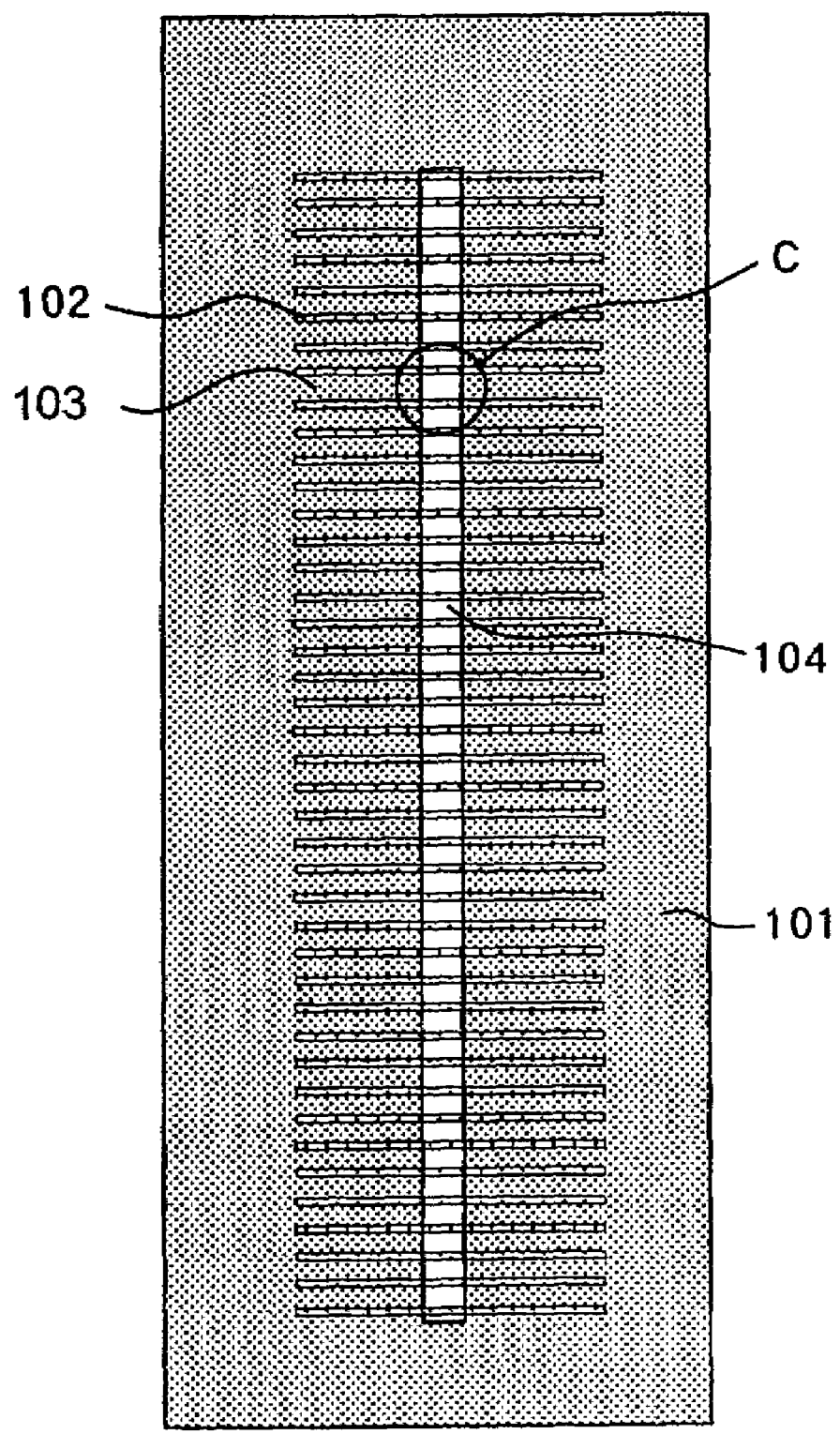
FIG. 15 shows a mask for use in the projection exposure apparatus shown in FIG. 14 viewed from the front side.
Figure 16:
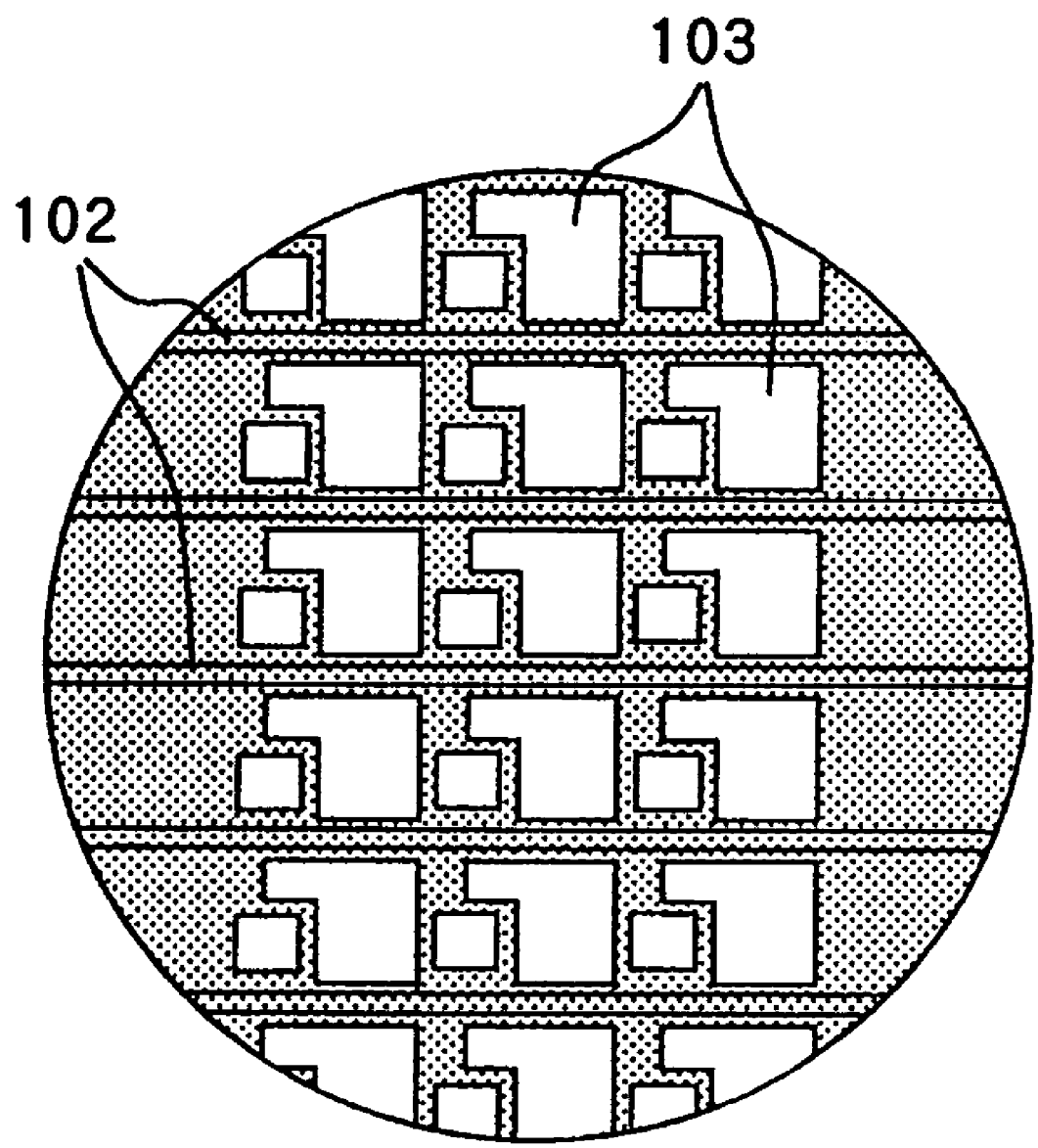
FIG. 16 is an enlarged view of a portion C in FIG. 15.

In FIG. 14, reference numeral 101 shows a mask for projection exposure serving as an embodiment of the present invention. FIGS. 15 and 16 (FIG. 16 is an enlarged view of a portion C in FIG. 14) show the structure of the mask 101.

The mask 101 has a first mask pattern 102 of a reflecting type formed on the back surface side for exposing a substrate under exposure to form a continuous pattern thereon and a second mask pattern 103 of a transmitting type formed on the front surface side for exposing the substrate to form a discontinuous cyclic pattern thereon, similar to the mask 1" described in Embodiments 2 to 4. Pattern elements of the first mask pattern 102 and pattern elements of the second mask pattern 103 are formed alternately in the longitudinal direction of an irradiation area 104 of illumination light.

In the mask of each of Embodiments 1 to 4 in which the projection system is formed of the mirrors, the illumination area has an arc slit-like shape, and thus the second mask pattern is accordingly arranged in an arc shape. In Embodiment 5, however, the projection system is formed of lenses, and thus the mask 101 has an illumination area in a linear (rectangular) slit-like shape. The second mask pattern 103 is accordingly arranged in a rectangular shape.

In FIG. 14, reference numeral 47 shows a projection lens, which is advantageously telecentric on the mask side in Embodiment 5. The lens does not need to be telecentric on the side of the substrate 25'. Embodiment 5 is described for the case wherein a one-sided telecentric lens with a magnification of n is employed as the projection lens 47.

Reference numeral 45 shows a polarization beam splitter. Reference numerals 46*a* to 46*b* show one quarter wave plates which are provided on surfaces of the polarization beam splitter 45 opposite to the mask 101 and a high-resolution reflecting type mask 48, later described.

Reference numeral 41 shows a first illumination system, which has a light source 16 formed of an extra-high pressure mercury lamp, an elliptical mirror 17, an integrator lens 43, and a condenser lens 44. The first illumination system 41 irradiates illumination light to the reflecting type first mask pattern 102 provided for the mask 101 from the side of the projection system through the polarization beam splitter 45.

A second illumination system 20' irradiates illumination light to the second mask pattern of a transmission type provided for the mask 101 from the opposite side of the mask 101 to the projection system. The first and second illumination systems 41 and 20' are controlled by a control circuit (not shown), which controls scan driving of a substrate stage 28 on which the substrate 25' is mounted in synchronization with the scan driving.

Figure 17:
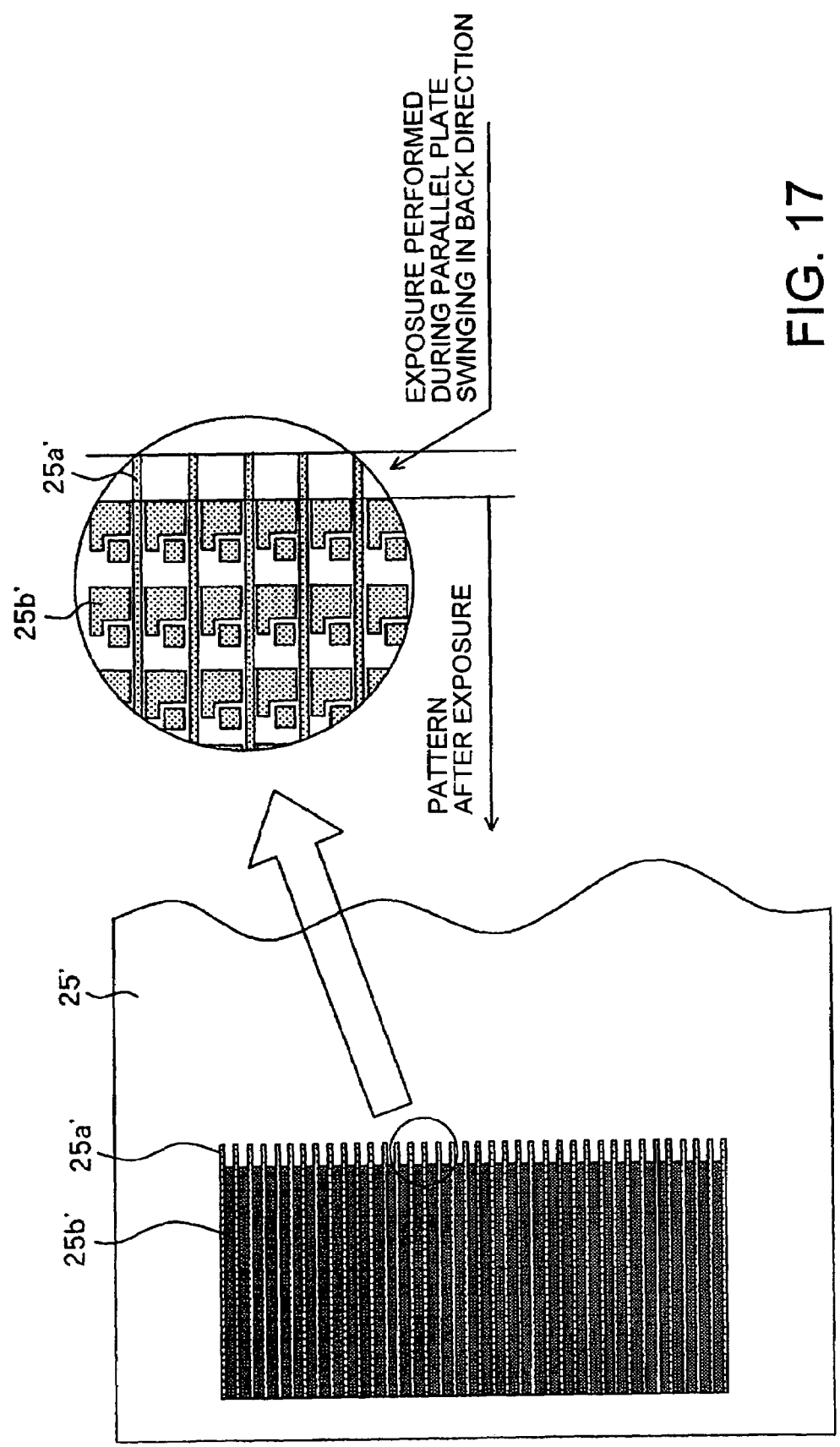
FIG. 17 shows a substrate under exposure which is being subjected to patterning through exposure by the projection exposure apparatus shown in FIG. 14.
Figure 18:
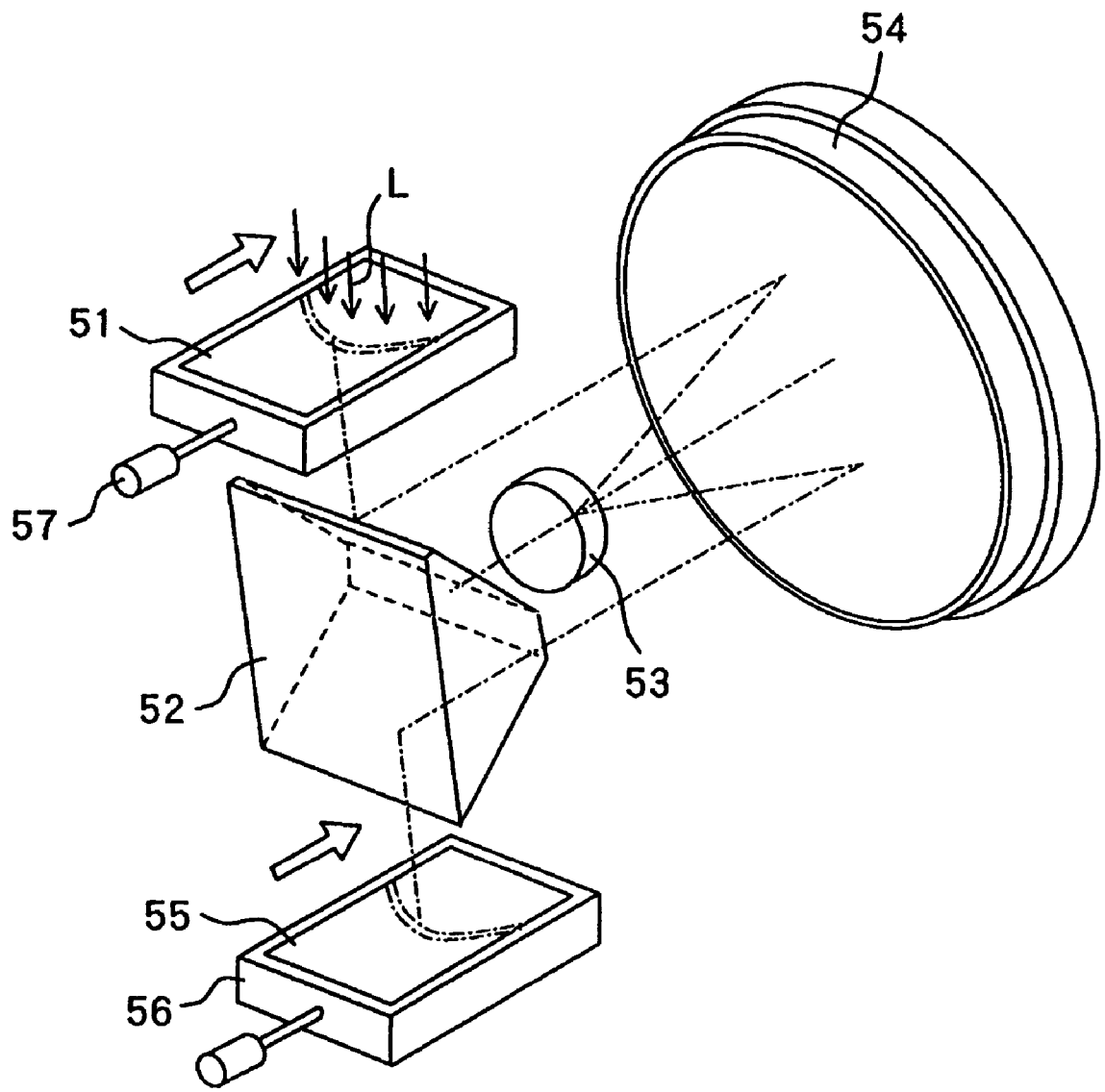
FIG. 18 shows the structure of a conventional reflecting type projection exposure apparatus.

FIG. 17 shows the substrate 25', which is being exposed, to form patterns thereon by the projection exposure apparatus of Embodiment 5.

FIG. 17 shows a continuous pattern 25*a*' after exposure, and a plurality of pattern elements of a discontinuous cyclic pattern 25*b*' after exposure, on the substrate 25'. The next pattern element of the discontinuous cyclic pattern elements of the continuous pattern 25*a* after exposure extends to the right in the substrate 25' in FIG. 17 (in the opposite direction to scan driving direction of the substrate 25') from the pattern elements of the discontinuous cyclic pattern 25*b*' after exposure.

The illumination light irradiated to the mask 101 from the first and second illumination systems 41 and 20' of Embodiment 5 is linear (rectangular) slit-like illumination light as described above. The longitudinal direction of the slit-like illumination light is orthogonal to the sheet of FIG. 14, which shows the projection exposure apparatus.

Thus, the condenser lens 44 provided for the first illumination system 41 has an oval shape in which two unnecessary portions are removed. The illumination light emitted from the light source 16 of the first illumination system 41 is reflected by the elliptical mirror 17 and once formed into an image to form a second light source, and then, the distribution of the illumination intensity is unified by the integrator lens 43. The luminous flux is incident on the condenser lens 44 in a linear slit-like shape, condensed thereby, and then incident on the polarization beam splitter 45.

Of the illumination luminous flux incident on the polarization beam splitter 45, a specific polarized light component (P-polarized light or S-polarized light) is reflected by a polarized light splitting film of the polarization beam splitter 45 toward the mask 101, transmitted through the ¼ wave plate 46*a*, and illuminates the first mask pattern 102 on the back surface side (on the side of the projection lens 47) of the mask 101. The exposure light reflected by the first mask pattern 102 is again transmitted through the ¼ wave plate 46*a* and again incident on the polarization beam splitter 45. In this manner, the exposure light (the illumination light) is transmitted through the one-quarter wave plate 46*a* on a go path and a return path (twice), so that the polarization direction is changed ninety degrees from the polarization direction at the time of reflection by the polarized light splitting film.

Thus, the exposure light incident on the polarization beam splitter 45 is transmitted through the polarized light splitting film and transmitted through the projection lens 47 to form the image of the first mask pattern at a predetermined projection magnification at the focus position on the side of an image plane.

The surface of the substrate 25' is disposed at the focus position on the image plane side, and the substrate 25' is exposed to form the first mask pattern image projected by the projection lens 47. The substrate 25' is driven for scanning in a direction substantially orthogonal to the optical axis of the projection lens 47 to expose the substrate 25' to form the continuous pattern extending without interruption in the scan driving direction.

In addition, the second illumination system 20' performs flash or pulse illumination on the second mask pattern 103 of the mask 101 each time the substrate 25' is driven by a predetermined amount. Thus, the exposure light transmitted through the second mask pattern 103 is transmitted through the one quarter wave plate 46a, the polarization beam splitter 45, and the projection lens 47, to expose the substrate 25' to form the discontinuous cyclic pattern thereon.

In this manner, the substrate 25' is exposed to form the continuous pattern 25a' and the discontinuous cyclic pattern 25b' consisting of pattern elements arranged with a predetermined interval between adjacent ones with a series of exposure steps (a single process).

As shown in parentheses in FIG. 14, a parallel plate 32 may be disposed swingably in the projection system closest to the image plane in Embodiment 5, similar to Embodiment 4.

In this case, as described with the flow chart of FIG. 11 in Embodiment 4, a control circuit, not shown, controls the substrate stage 28, the first and second illumination systems 41 and 20', and the parallel plate 32.

In Embodiment 5, the first illumination system 41 uses only the light polarized in the specific polarization direction reflected by the polarized light splitting film of the polarization beam splitter 45 as the exposure light, of the incoherent luminous flux emitted from the light source 16. However, polarized light transmitted through the polarized light splitting film may be used to achieve multiple exposure described as the variation of Embodiment 1.

In this case, as shown in FIG. 14, the polarized light transmitted through the polarized light splitting film of the polarization beam splitter 45 is irradiated to the high-resolution reflecting type mask 48 through the one-quarter wave plate 46b. The high-resolution reflecting type mask 48 has a reflecting type mask pattern for fine pattern exposure formed thereon with the minimum pattern width smaller than the minimum pattern width of the first mask pattern 102, similar to the third mask pattern shown by reference numeral 2a in FIG. 6.

The exposure light reflected by the high-resolution reflecting type mask 48 returns to the polarization beam splitter 45 through the one quarter wave plate 46b. The polarization direction thereof is changed ninety degrees from the polarization direction at the time of the transmission through the polarized light splitting film for the first time since the light is transmitted through the one quarter wave plate 46b on a go path and a return path (twice). Thus, the exposure light from the high-resolution reflecting type mask 48 is reflected by the polarized light splitting film of the polarization beam splitter 45 and guided to the projection lens 47.

The pattern image of the high-resolution reflecting type mask 48 is superimposed on the image of the first mask pattern 102 and the image of the second mask pattern 103 of the mask 101 to form the image on the surface of the substrate 25' provided at the focus position of the projection lens 47. In this manner, the substrate 25' is exposed to form the fine pattern of the high-resolution reflecting type mask 48 thereon together with the continuous pattern of the first mask pattern 102 and the discontinuous cyclic pattern of the second mask pattern 103 with a series of exposure steps (a single process).

The fine pattern contributes to improvement in exposure profiles of the continuous pattern and the discontinuous cyclic pattern in a similar manner to that described in a number of proposals for multiple exposure.

Each of Embodiments 1 to 5 has been described for the case wherein the first mask pattern for providing the continuous pattern is formed as the reflecting type mask pattern and the second mask pattern for providing the discontinuous cyclic pattern is formed as the transmitting type mask pattern in the mask. However, it is possible that the first mask pattern is formed as a transmitting type mask pattern and a second mask pattern is formed as a reflecting type mask pattern.

In addition, each of Embodiments 1 to 5 has been described for the mask for exposing the substrate under exposure to form the continuous pattern and the discontinuous cyclic pattern consisting of the pattern elements disposed at regular intervals (the isolated repetitive pattern elements). However, the pattern element of the discontinuous pattern referred to in the present invention is not necessarily repeated at regular intervals, and it is essential only that each is an isolated (discontinuous) pattern element.

In addition, while each of Embodiments 1 to 5 has been described for the scan type and step-and-repeat type projection exposure apparatuses, the present invention is applicable to a projection exposure apparatus of another type, such as a step-and-scan type.

As described above, according to each of Embodiments 1 to 5, it is possible to complete the exposure for the continuous pattern and the exposure for the discontinuous cyclic pattern through a series of exposure steps (a single process) without moving the mask.

Only the member under exposure can be driven without moving the mask to reduce the length of the mask in the driving direction of the member. It is thus possible to suppress deformation of the mask due to its own weight even when the mask is supported at the peripheral portions.

Since only the member needs to be controlled for driving, the control is simplified as compared with the driving control of both of the mask and the member in synchronization, thereby making it possible to enhance reliability of exposure performance. In addition, the cost of the mask can be reduced in association with a reduction in the size of the mask.

While preferred embodiments have been described, it is to be understood that modifications and variations of the present invention may be made without departing from the scope of the following claims.

What is claimed is:

1. A projection exposure mask comprising:
   a first mask pattern for exposing a member to form a continuous pattern thereon; and
   a second mask pattern for exposing the member to form a discontinuous pattern thereon,
   wherein one of the first and second mask patterns is a reflecting type mask pattern and the other mask pattern is a transmitting type mask pattern.

2. The projection exposure mask according to claim 1, wherein the reflecting type mask pattern reflects light incident from one surface side of the projection exposure mask, and the transmitting type mask pattern transmits light incident from the other surface side of the projection exposure mask.

3. The projection exposure mask according to claim 1, wherein an irradiation area of light irradiated to the reflecting type mask pattern and the transmitting type mask pattern has a linear or arc slit-like shape, and
  each of the mask patterns has pattern elements which are provided alternately in a longitudinal direction of the irradiation area.

4. The projection exposure mask according to claim 1, further comprising a third mask pattern which has a minimum pattern width smaller than a minimum pattern width of the first mask pattern, the third mask pattern being provided in a portion of an area in which the first mask pattern is provided in the projection exposure mask, wherein the third mask pattern is a mask pattern of the same type as the first mask pattern of the reflecting type and the transmitting type mask patterns.

5. A projection exposure apparatus comprising:
  the projection exposure mask according to claim 1; and
  an optical system which employs the projection exposure mask to expose a member to form a continuous pattern and a discontinuous pattern thereon.

6. A method of projection exposure comprising the steps of:
  providing the projection exposure mask according to claim 1; and
  exposing a member to form a continuous pattern and a discontinuous pattern thereon by using the projection exposure mask.

7. A method of manufacturing a projection exposure mask which includes a first mask pattern for exposing a member to form a continuous pattern thereon and a second mask pattern for exposing the member to form a discontinuous pattern thereon, one of the first and second mask patterns being a reflecting type mask pattern and the other mask pattern being a transmitting type mask pattern, the method comprising:
  a first step of preparing a transparent substrate having a reflecting film formed on a surface thereof;
  a second step of applying a resist on the reflecting film and performing exposure and development on the resist to form a shape of a base portion for forming the reflecting type mask pattern and a shape of the transmitting type mask pattern;
  a third step of applying a resist on the reflecting film having the shape of the base portion and the shape of the transmitting type mask pattern after the development at the second step, performing exposure to form a shape of the reflecting mask pattern on the resist on the base portion, and performing development thereon;
  a fourth step of forming an anti-reflection film on the reflecting film in an area in which the resist is removed at the third step; and
  a fifth step of removing the resist in the shape of the reflecting type mask pattern left in the development at the third step.

* * * * *

UNITED STATES PATENT AND TRADEMARK OFFICE
CERTIFICATE OF CORRECTION

PATENT NO. : 7,193,684 B2
APPLICATION NO. : 11/331193
DATED : March 20, 2007
INVENTOR(S) : Kazuo Iizuka et al.

It is certified that error appears in the above-identified patent and that said Letters Patent is hereby corrected as shown below:

COLUMN 4:
  Line 31, "expose" should read -- exposure --.

COLUMN 5:
  Line 55, "pattern 3" should read -- pattern 2 --.

COLUMN 6:
  Line 2, "FIG. 3(b)" should read -- FIG. 3B --.
  Line 6, "3(e)," should read -- 3E, --.
  Line 21, "reflections" should read -- reflecting --.
  Line 25, "numeral" should read -- numerals --.
  Line 42, "1c." should read --11c. --.

COLUMN 7:
  Line 25, "change" should read -- change it --.

COLUMN 8:
  Line 53, "prims" should read -- prism --.
  Line 57, "pattern 2" should read -- pattern 3 --.

COLUMN 13:
  Line 56, "mark" should read -- mask --.

COLUMN 14:
  Line 31, "expenses" should read -- exposures --.

Signed and Sealed this

Twenty-seventh Day of November, 2007

JON W. DUDAS
*Director of the United States Patent and Trademark Office*